(12) United States Patent
Lin et al.

(10) Patent No.: US 11,289,585 B2
(45) Date of Patent: Mar. 29, 2022

(54) SEMICONDUCTOR DEVICES AND METHODS OF FORMATION

(71) Applicant: Taiwan Semiconductor Manufacturing Co., Ltd., Hsinchu (TW)

(72) Inventors: Shih-Yao Lin, New Taipei (TW); Kuei-Yu Kao, Hsinchu (TW); Chen-Ping Chen, Toucheng Township (TW); Chih-Han Lin, Hsinchu (TW); Ming-Ching Chang, Hsinchu (TW); Chao-Cheng Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/889,427

(22) Filed: Jun. 1, 2020

(65) Prior Publication Data
US 2021/0273072 A1    Sep. 2, 2021

Related U.S. Application Data

(60) Provisional application No. 62/982,446, filed on Feb. 27, 2020.

(51) Int. Cl.
*H01L 29/66* (2006.01)
*H01L 29/78* (2006.01)
*H01L 29/08* (2006.01)

(52) U.S. Cl.
CPC ...... *H01L 29/6656* (2013.01); *H01L 29/0847* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| 8,728,332 B2 | 5/2014 | Lin et al. |
| 8,796,666 B1 | 8/2014 | Huang et al. |
| (Continued) | | |

FOREIGN PATENT DOCUMENTS

| TW | 201916129 A | 4/2019 |
| TW | 202002163 A | 1/2020 |

OTHER PUBLICATIONS

U.S. Appl. No. 16/780,068, filed Feb. 3, 2020. Specification and Drawings, 45 pages.

*Primary Examiner* — Ali Naraghi
(74) *Attorney, Agent, or Firm* — Slater Matsil, LLP

(57) ABSTRACT

Semiconductor devices and methods of forming are described herein. The methods include depositing a dummy gate material layer over a fin etched into a substrate. A gate mask is then formed over the dummy gate material layer in a channel region of the fin. A dummy gate electrode is etched into the dummy gate material using the gate mask. A top spacer is then deposited over the gate mask and along sidewalls of a top portion of the dummy gate electrode. An opening is then etched through the remainder of the dummy gate material and through the fin. A bottom spacer is then formed along a sidewall of the opening and separates a bottom portion of the dummy gate electrode from the opening. A source/drain region is then formed in the opening and the dummy gate electrode is replaced with a metal gate stack.

18 Claims, 22 Drawing Sheets

(56) References Cited

U.S. PATENT DOCUMENTS

| | | |
|---|---|---|
| 8,822,243 B2 | 9/2014 | Yan et al. |
| 8,987,142 B2 | 3/2015 | Lee et al. |
| 9,053,279 B2 | 6/2015 | Chang et al. |
| 9,093,530 B2* | 7/2015 | Huang .............. H01L 21/30604 |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 10,304,677 B2 | 5/2019 | Kao et al. |
| 10,950,434 B2 | 3/2021 | Jhan et al. |
| 2018/0166319 A1 | 6/2018 | Park et al. |
| 2018/0197971 A1* | 7/2018 | Zhao ................ H01L 21/76802 |
| 2019/0131424 A1* | 5/2019 | Xu ...................... H01L 29/7853 |
| 2020/0135571 A1* | 4/2020 | Wang ................. H01L 29/6681 |
| 2020/0350171 A1* | 11/2020 | Zhou .................. H01L 29/4983 |
| 2020/0411514 A1 | 12/2020 | Lin et al. |
| 2021/0013322 A1* | 1/2021 | Xie ................... H01L 21/76224 |

* cited by examiner

SEMICONDUCTOR DEVICES AND METHODS OF FORMATION

PRIORITY CLAIM AND CROSS-REFERENCE

This application claims the benefit of U.S. Provisional Application No. 62/982,446, entitled: "Dummy Features in Transistors and Methods of Forming Thereof," filed on Feb. 7, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1B and 1C to 3A and 3B illustrate cross-sectional views of forming fins in a substrate, isolation regions between the fins, and forming dummy gate electrodes over the fins in intermediate steps of forming the semiconductor device, according to some embodiments.

FIGS. 6A and 6B to 8C and 8D illustrate formation of bottom spacers in the recesses of the dummy gate electrodes and source/drain regions forming in the openings through the fins, in accordance with some embodiments.

FIGS. 10A and 10B to 11A and 11B illustrate the recessing of the top spacers and/or recessing of the bottom spacers and further illustrate the formation of the gate electrode stacks, in accordance with some other embodiments.

FIGS. 12A and 12B to 16A and 16B illustrate the top spacers and the bottom spacers, in accordance with still other embodiments.

DETAILED DESCRIPTION

Figure 1A:
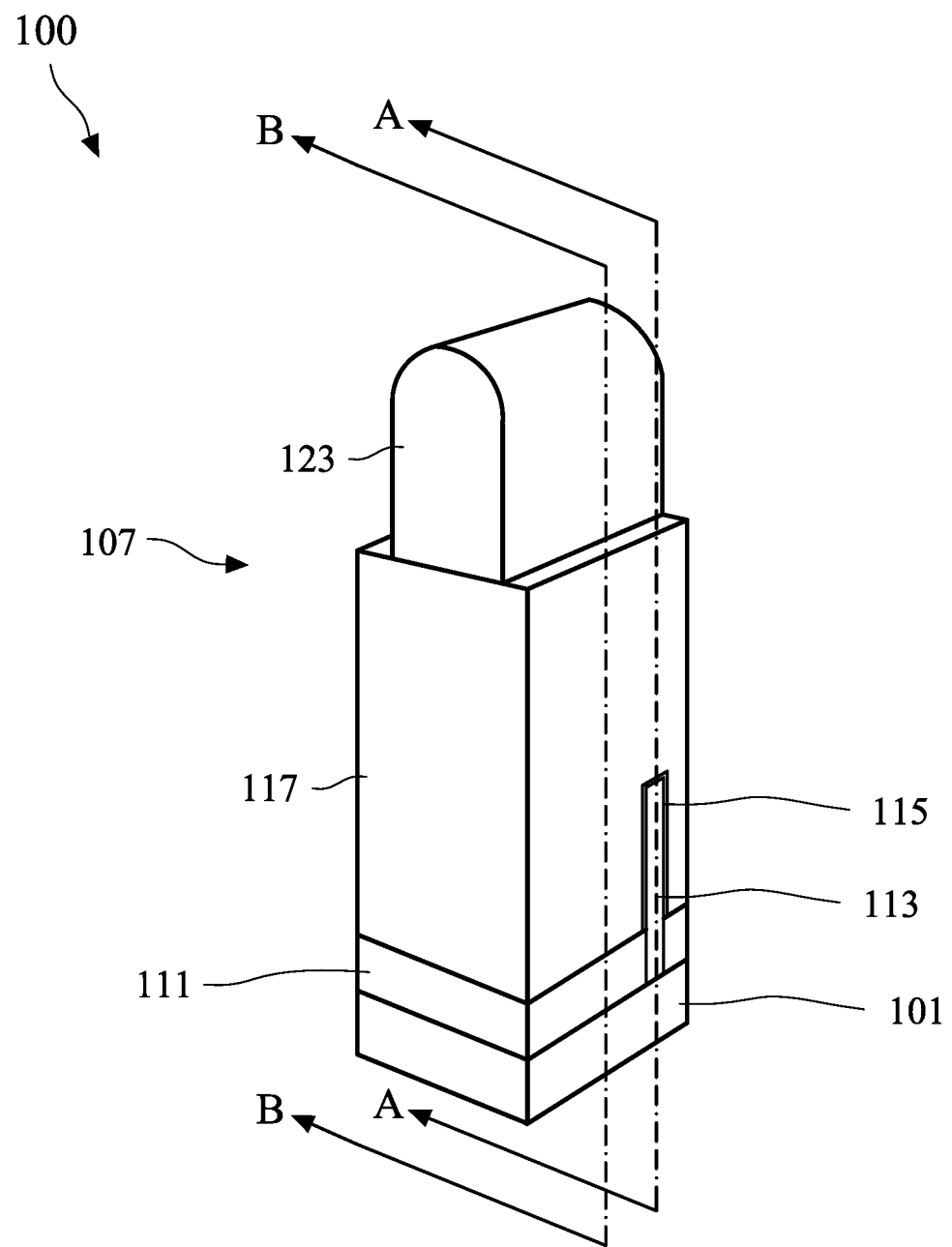
FIG. 1A illustrates a perspective view of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, there is illustrated a perspective view of a formation of a semiconductor device 100 with a fin field effect transistor (FinFET) 107 formed at least partially over a substrate 101. The semiconductor device 100 may be located in a core region or an I/O region and may comprise parts of logic devices, memory devices, combinations of these, or the like, which are utilized to perform the desired functions of the semiconductor device 100 or to transmit and receive signals into and out of the semiconductor device 100. However, any suitable regions and any suitable functionalities may be utilized.

The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device.

Within the core region and/or the I/O region of the semiconductor device 100, a plurality of the fin field effect transistor (FinFET) 107 is formed, with only one such device being illustrated in FIG. 1A for clarity. In devices formed in the core region, fewer fins may be implemented to form a respective transistor, and a spacing between neighboring gates (and hence, a width of an intervening source/drain region) may be smaller than other regions (e.g., the I/O region).

Portions of the substrate 101 may be removed as an initial step in the eventual formation of isolation regions 111. The portions of the substrate 101 may be removed using a masking layer (not separately illustrated in FIG. 1A) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed.

As one of skill in the art will recognize, however, the processes and materials described above to form the masking layer are not the only method that may be used to protect portions of the substrate 101 while exposing other portions of the substrate 101. Any suitable process, such as a patterned and developed photoresist, may be utilized to expose portions of the substrate 101 to be removed. All such methods are fully intended to be included in the scope of the present embodiments.

Once a masking layer has been formed and patterned, the portions of the substrate 101 may be removed. The exposed substrate 101 may be removed through a suitable process such as reactive ion etching (RIE) in order to remove the portions of the substrate 101, although any suitable process may be used. In an embodiment, the portions of the substrate 101 may be removed to a first depth of less than about 5,000 Å from the surface of the substrate 101.

However, as one of ordinary skill in the art will recognize, the process described above is merely one potential process, and is not meant to be the only embodiment. Rather, any suitable process through which the portions of the substrate 101 may be removed may be utilized and any suitable process, including any number of masking and removal steps may be used.

Additionally, the masking and etching process additionally forms the fins 113 from those portions of the substrate 101 that remain unremoved. For convenience the fins 113 have been illustrated in the figures as being separated from the substrate 101, although a physical indication of the separation may or may not be present. These fins 113 may be used, as discussed below, to form the channel region of multiple-gate FinFET transistors. While FIG. 1A only illustrates one of the fins 113 formed from the substrate 101, any number of fins 113 may be utilized.

The fins 113 may be formed such that they have a width at the surface of the substrate 101 of between about 5 nm and about 80 nm. Furthermore, while a particular process of forming the fins 113 has been described, the fins 113 may be patterned by any suitable method. For example, the fins 113 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 113.

Once the fins 113 have been formed, a dielectric material may be deposited and the dielectric material may be recessed to form the isolation regions 111. The dielectric material may be an oxide material, a high-density plasma (HDP) oxide, or the like. The dielectric material may be formed, after optional cleaning and lining steps, using either a chemical vapor deposition (CVD) method (e.g., the HARP process), a high density plasma CVD method, or other suitable method of formation as is known in the art.

The deposition process may fill or overfill the regions around the fins 113 and then excess material may be removed from over the fins 113 through a suitable process such as chemical mechanical polishing (CMP), an etch, a combination of these, or the like. In an embodiment, the removal process removes any dielectric material that is located over the fins 113 as well, so that the removal of the dielectric material will expose the surface of the fins 113 to further processing steps.

Once planarized, the dielectric material may then be recessed away from the surface of the fins 113. The recessing may be performed to expose at least a portion of the sidewalls of the fins 113 adjacent to the top surface of the fins 113. The dielectric material may be recessed using a wet etch by dipping the top surface of the fins 113 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 113 of between about 50 Å and about 500 Å. Additionally, the recessing may also remove any leftover dielectric material located over the fins 113 to ensure that the fins 113 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized. All of the potential process steps are fully intended to be included within the scope of the present embodiment.

After the isolation regions 111 have been formed, a dummy gate dielectric 115 and a dummy gate electrode 117 may be formed over each of the fins 113. In an embodiment the dummy gate dielectric 115 may be formed by thermal oxidation, chemical vapor deposition, sputtering, or any other methods known and used in the art for forming a gate dielectric. Depending on the technique of gate dielectric formation, the dummy gate dielectric 115 thickness on the top of the fins 113 may be different from the gate dielectric thickness on the sidewall of the fins 113.

The dummy gate dielectric 115 may comprise a material such as silicon dioxide or silicon oxynitride with a thickness ranging from about 3 Å to about 100 Å. The dummy gate dielectric 115 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 Å to about 100 Å. Additionally, any combination of silicon dioxide, silicon oxynitride, and/or high-k materials may also be used for the dummy gate dielectric 115.

According to some embodiments, a gate oxide (e.g., oxide liner) may be formed over the fins 113 prior to the formation of the dummy gate dielectric 115. Once the gate oxide has been formed, the dummy gate dielectric 115 may be formed over the fins 113 and the gate oxide and the dummy gate dielectric 115 may be patterned, as set forth above.

The dummy gate electrode 117 may comprise a conductive or non-conductive material and may be a silicon-based material such as silicon, SiGE, SiN, SiC, SiON, combinations, or the like and may be, although any suitable materials such as polysilicon may also be utilized. According to some embodiments, the dummy gate electrode 117 may be formed using a complex dummy gate material layer 125 (see, e.g., FIG. 1B-1C) including a bottom layer comprising a first dummy gate material 119 and a top layer comprising a second dummy gate material 121 that is different from the first dummy gate material 119.

In some embodiments, the first dummy gate material 119 may be selected to have an etch rate that is greater than the etch rate of the fin 113. Selecting the materials of the first dummy gate material 119, the second dummy gate material 121 and the fins 113 with the different etch rates is useful in patterning the dummy gate electrodes 117, as is described in greater detail below. For example, in embodiments where the fins 113 are formed using silicon (Si), the first dummy gate material 119 may be formed using silicon germanium (SiGe) and the second dummy gate material 121 may be formed using silicon (Si). As such, the etch rate of the first dummy gate material 119 may be greater than the etch rate of the fin 113. In still other embodiments in which the fins 113 are a material such as silicon germanium, the first dummy gate material 119 may also be silicon germanium, but may have a higher concentration of germanium in order to generate different etch rates.

According to some embodiments, the materials of the complex dummy gate material layer 125 may be deposited by one or more processes such as chemical vapor deposition (CVD), physical vapor deposition (PVD), plasma enhanced chemical vapor deposition (PECVD), atomic layer deposition (ALD), sputter deposition, epitaxial growth, or other techniques known and used in the art for depositing materials. The thickness of the complex dummy gate material layer 125 may be in the range of about 5 Å to about 200 Å, according to some embodiments, although any suitable thickness may be used. The top surface of the complex dummy gate material layer 125 may have a non-planar top surface, and may be planarized using, for example, a chemical mechanical planarization (CMP) process prior to patterning of the complex dummy gate material layer 125. Ions may or may not be introduced into the complex dummy gate material layer 125 at this point. Ions may be introduced, for example, by ion implantation techniques.

Once the complex dummy gate material layer 125 has been formed, the dummy gate electrode 117 may be patterned. The dummy gate electrode 117 may define a single channel or may define multiple channel regions located within the fin 113 beneath the dummy gate dielectric 115. The dummy gate electrode 117 may be formed by initially depositing and patterning a gate mask 123 on the dummy gate material layer using, for example, deposition and photolithography techniques known in the art. The gate mask 123 may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The material of the gate mask 123 may be etched using a dry etching process to form the gate mask 123.

FIG. 1A further illustrates several cut lines through the semiconductor device 100 that will be referenced throughout the following discussion and with regard to the remaining figures. In particular, FIG. 1A illustrates a first cutline A-A taken through a vertical section in the fin 113 (e.g., a "cut-on-fin" view) and a second cutline B-B taken through a vertical section adjacent the fin 113 (e.g., a "cut-without-fin" view).

Figures 1B, 1C:
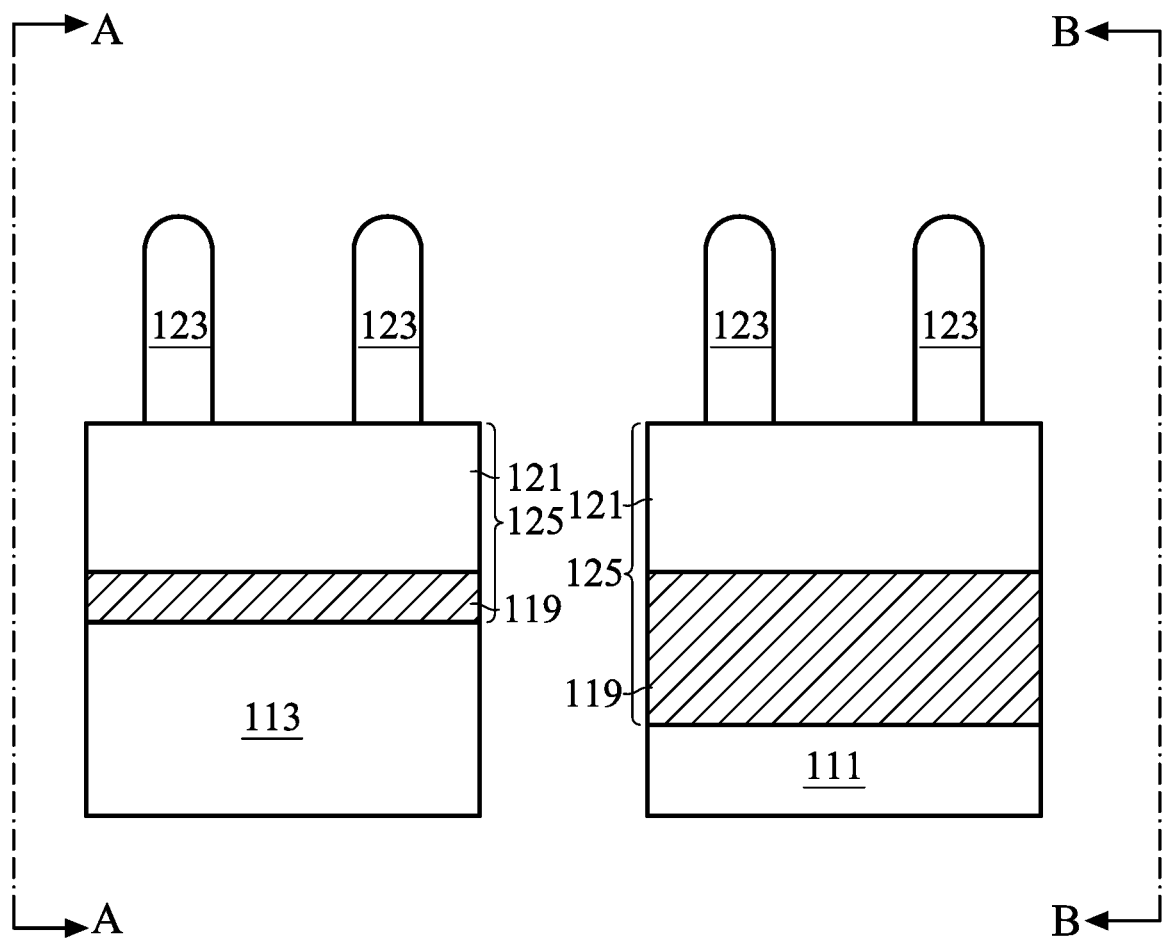

FIGS. 1B and 1C illustrate cross-sectional views along the first cutline A-A (e.g., the "cut-on-fin" view) and the second cutline B-B (e.g., the "cut-without-fin" view) in an intermediate step of forming the FinFET 107, according to some embodiments. The intermediate step includes forming the dummy gate material layer as a complex dummy gate material layer 125 and forming two of the gate masks 123 over the complex dummy gate material layer 125, according to some embodiments.

Figures 2A, 2B:
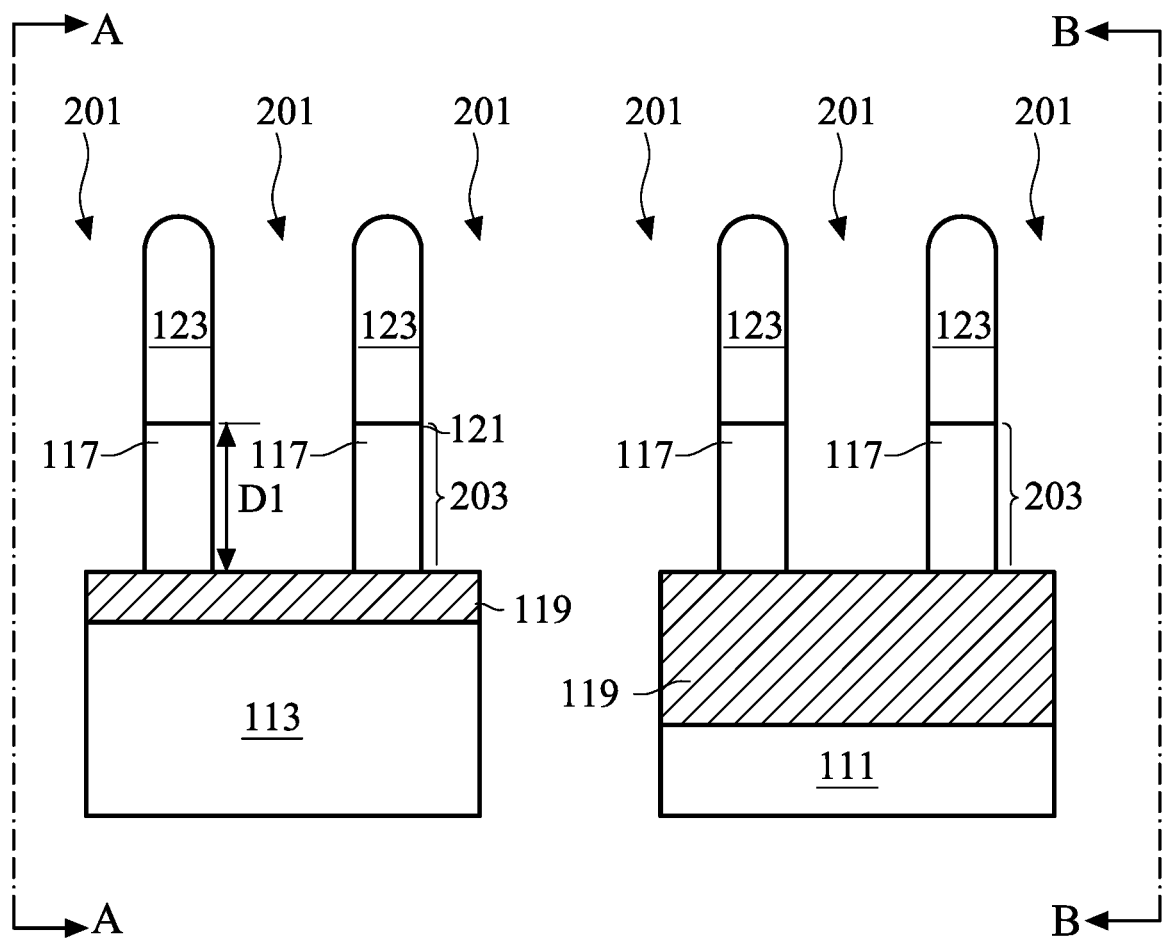

FIGS. 2A and 2B illustrate cross-sectional views along the first cutline A-A and second cutline B-B and additionally illustrate a first patterning step to form top portions 203 of the dummy gate electrodes 117 in an intermediate step of forming the FinFET 107, according to some embodiments. Once the gate masks 123 have been formed, a dry etching process may be used to form openings 201 in the second dummy gate material 121 (e.g., silicon (Si)) and/or into the first dummy gate material 119 (e.g., silicon germanium (SiGe)), in accordance with some embodiments. However, any suitable etching process may be used to form the openings 201. As such, the top portions 203 of the dummy gate electrodes 117 are formed in the complex dummy gate material layer 125.

In some embodiments, the top portions 203 of the dummy gate electrodes 117 comprise a single material (e.g., the second dummy gate material 121). In other embodiments, the top portions 203 comprise multiple materials (e.g., the second dummy gate material 121 and the first dummy gate material 119). According to some embodiments the openings 201 may be formed to a first depth D1 that is between about 5 nm and about 300 nm. However, any suitable depth may be used.

Figures 3A, 3B:
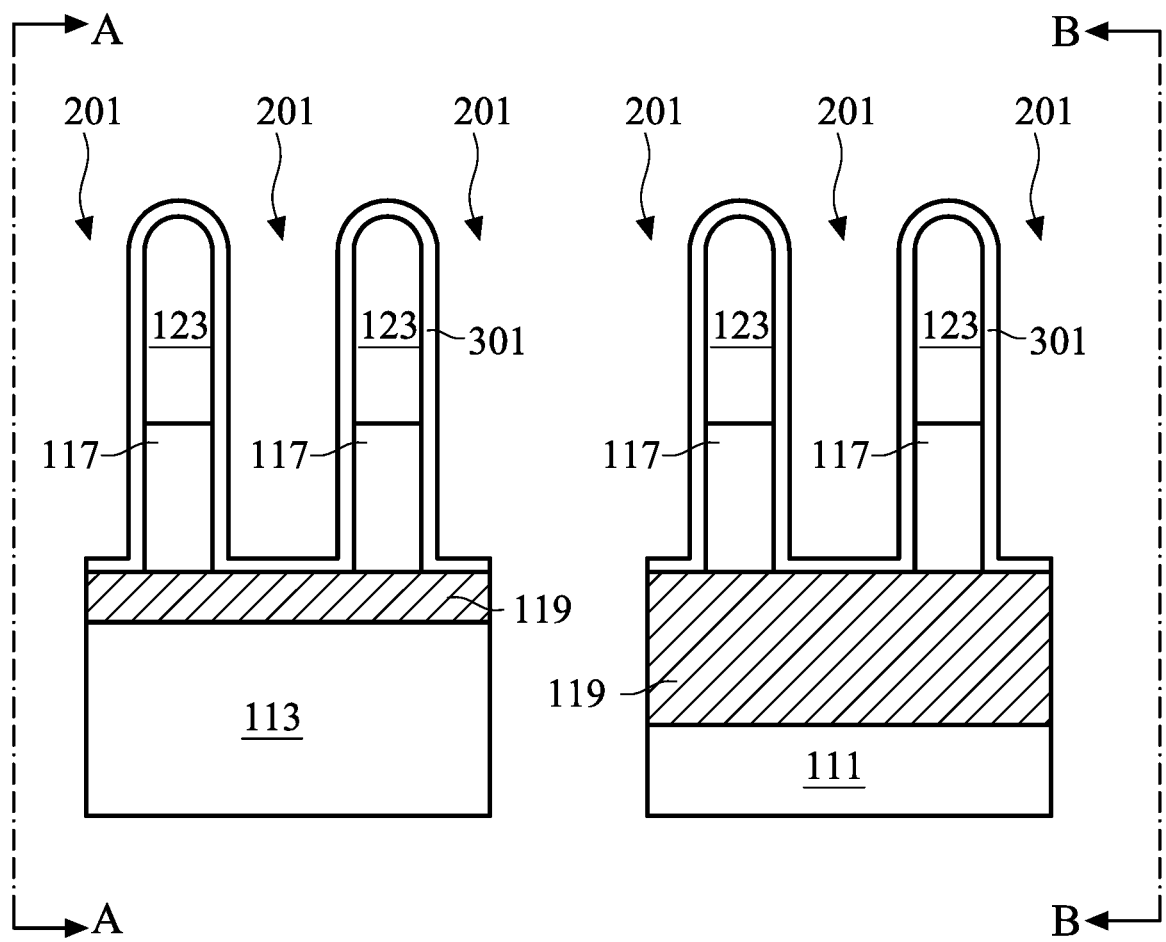

FIGS. 3A and 3B illustrate cross-sectional views along the first cutline A-A and second cutline B-B and additionally illustrate an initiation of the formation of a top spacer 301 adjacent to the gate masks 123 and the dummy gate electrodes 117 and over the exposed surface of the first dummy gate material 119. The material of the top spacers 301 may comprise one material layer (e.g., a single film) or may comprise multiple material layers (e.g., multiple films) such as two films, three films, or even as many as up to ten films. According to some embodiments, the material of the top spacer 301 may comprise a first dielectric material such as a silicon-based material such as SiN, SiON, SiOCN, SiC, SiOC, and $SiO_2$. The top spacer 301 may be formed in a blanket deposition to a thickness of between about 5 Å and about 500 Å, in accordance with some embodiments. In an embodiment the material of the top spacer 301 may be formed by initially using a deposition process such as chemical vapor deposition (CVD), physical vapor deposition (PVD), atomic layer deposition (ALD), plasma enhanced chemical vapor deposition (PECVD), a treatment such as oxidation, combinations of these, or the like. However, any suitable material, thickness, and method of formation may be utilized.

Figures 4A, 4B:
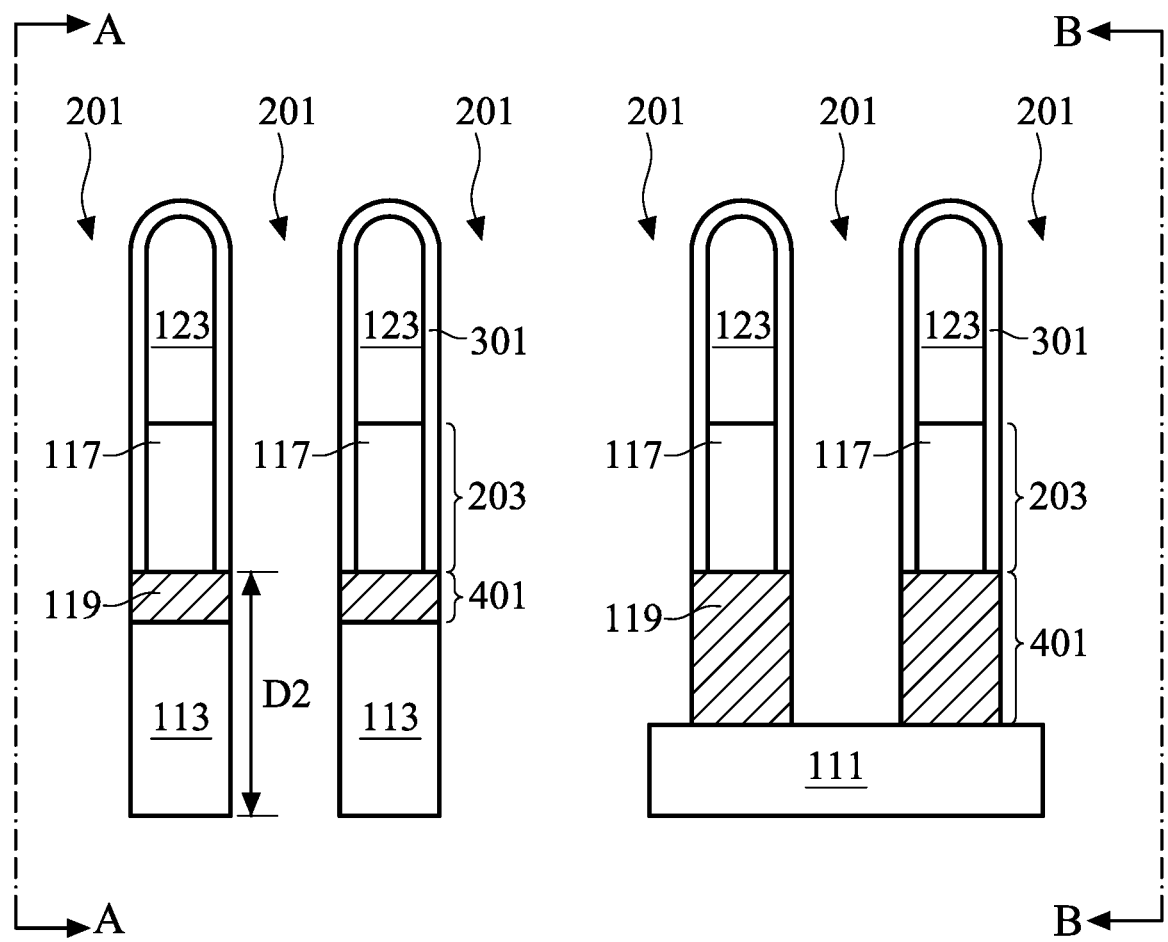
FIGS. 4A to 4C illustrate the formation of an opening through remaining portions of a dummy gate material and through the fins, in accordance with some embodiments.

FIGS. 4A and 4B illustrate cross-sectional views along the first cutline A-A and second cutline B-B and additionally illustrate a patterning step. According to some embodiments, the patterning step comprises an etching of the top spacers 301. Once formed, the material of the top spacers 301 may be patterned to form the top spacers 301. In an embodiment the material of the top spacers 301 are patterned using one or more anisotropic etching processes, such as reactive ion etches, in order to remove the material of the top spacers 301 from at least some of the horizontal surfaces of the structure.

For example, in some embodiments the material of the top spacers 301 may be removed from each horizontal surface of the structure. In other embodiments, the material of the top spacers 301 may be removed from the horizontal surfaces of the substrate 101 and the isolation regions 111 while over other horizontal surfaces or nearly horizontal surfaces such as the gate masks 123, the material of the top spacers 301 is merely thinned and is not removed enough to expose the underlying structures. Any suitable patterning process may be utilized.

The patterning step further comprises extending the openings 201 through the remaining portion of the complex dummy gate material layer 125 (e.g., the first dummy gate material 119) and through the underlying material of the fins 113 (e.g., channel etch). During the patterning step, the gate masks 123 and the top spacers 301 protect the top portions 203 of the dummy gate electrodes 117. As such, the bottom portions 401 of the dummy gate electrodes 117 are formed from the remaining materials of the complex dummy gate material layer 125. In some embodiments, the bottom portions 401 of the dummy gate electrodes 117 comprise multiple materials (e.g., the second dummy gate material 121 and the first dummy gate material 119). In other embodiments, the bottom portions 401 comprise a single material (e.g., the first dummy gate material 119).

The removal of the exposed portions of the first dummy gate material 119 and the underlying material of the fins 113 from those areas that are not protected may be performed by a reactive ion etch (RIE) using the gate masks 123, the dummy gate electrodes 117 and the top spacers 301 as hardmasks, or by any other suitable removal process. The removal may be continued until the fins 113 are either planar with or below the surface of the isolation regions 111. Etching the exposed portions of the fins 113 in the patterning step with the first dummy gate material 119, there is no restriction of the space between fins 113 (e.g., channel to channel space) which allows for an enlarged etching capability. Furthermore, by selecting the material of the first dummy gate material 119 to be different from the material of the fins 113 (e.g., channel region), the patterning step may be performed using etching condition tuning to minimize and/or prevent damage to the tops of the channel regions when cutting through the fins 113.

According to some embodiments, the openings 201 extend to the bases of the fins 113 stopping on the substrate 101 (not shown in FIG. 4A) and outside of the fins 113 stopping on the isolation regions 111. In other embodiments, the openings 201 may extend below the bases of the fins 113 and into the substrate 101 and outside of the fins 113 extending into the isolation regions 111. According to some embodiments, the openings 201 extend below the top portions 203 of the dummy gate electrodes 117 to a second depth D2 of between about 10 nm and about 300 nm. However, any suitable depth may be used.

Figure 4C:
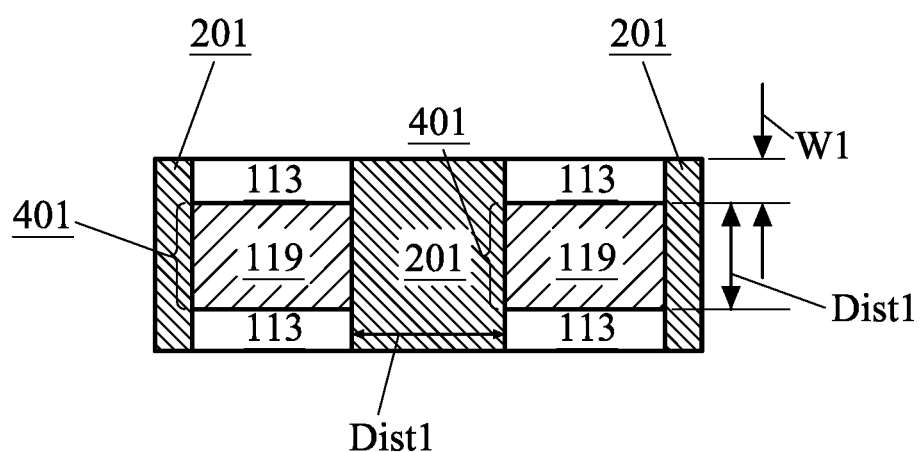

FIG. 4C illustrates a top down view below the channel after the patterning step has been performed (in a direction that is into and out of the page of FIGS. 4A and 4B). In particular, FIG. 4C illustrates the formation of the openings 201 through two of the fins 113. The fins 113 may be a first width W1 of between about 0.5 nm and about 20 nm. In some embodiments, the fins 113 may be separated from one another by a first distance Dist1 of between about 1 nm and about 300 nm. FIG. 4C further illustrates that the formation of the openings 201 separate the first dummy gate material 119 into two bottom portions 401 of the dummy gate electrodes 117, as illustrated in FIGS. 4A and 4B and also cut each of the fins 113 into two separate channel regions. In accordance with some embodiments, the separation between the two bottom portions 401 and the separation between the channel regions of the fins 113 may be a second distance Dist2 of between about 5 nm and about 1000 nm. However, any suitable distance may be used for the second distance Dist2.

Figures 5A, 5B:
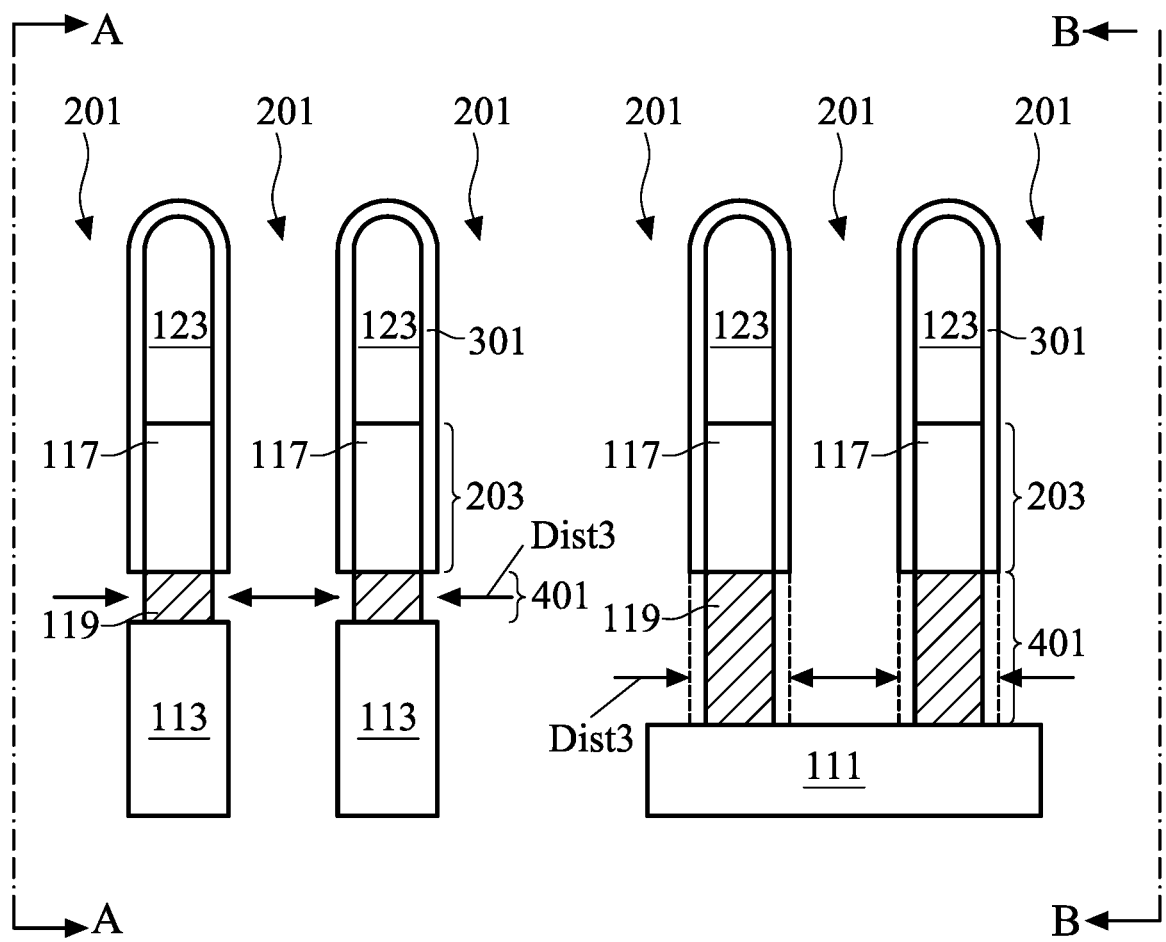
FIGS. 5A to 5C illustrate an etch pull-back process that is performed to recess bottom portions of the dummy gate electrodes, in accordance with some embodiments.
Figure 5C:
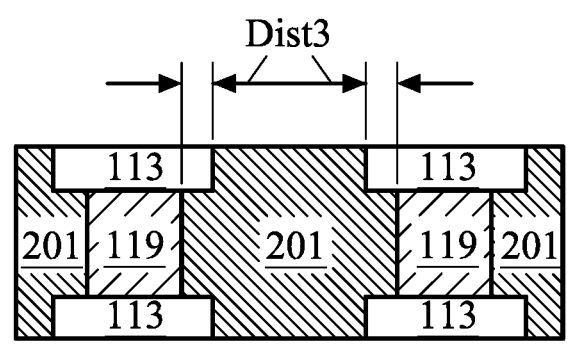

FIGS. 5A to 5C illustrate an etch pull-back process that is performed to recess the bottom portions 401 of the dummy gate electrodes 117. During the etch pull-back process, the bottom portions 401 are exposed and the top portions 203 are protected by the top spacer 301 and the gate masks 123. Furthermore, the precursors selected for the etch pull-back process may be highly selective to the exposed materials of the dummy gate electrode 117 and less selective to the materials of the fins 113 (e.g., channel regions). For example, the etch rate of the dummy gate electrode 117 is greater than the etch rate of the channel materials of the fins 113 for the etchant used. As such, the bottom portions 401 of the dummy gate electrode 117 may be recessed a third distance Dist3 from the sidewalls with little to no recessing of the fins 113. According to some embodiments, the third distance Dist3 may be a distance of between about 0.3 nm and about 50 nm. However, any suitable distance may be used.

According to some embodiments, the etch pull-back process may be performed using a plasma etch, a remote plasma etch, a radical etch, combinations, or the like. The etch pull-back process may use a first precursor (e.g., main gas), a second precursor (e.g., passivation gas), and/or a third precursor (e.g., dilute gas). According to some embodiments, the first precursor includes but is not limited to gases such as $Cl_2$, HBr, $CF_4$, $CHF_3$, $CH_2F_2$, $CH_3F$, $C_4F_6$, $BCl_3$, $SF_6$, $H_2$, or the like. The second precursor may be used in the etch pull-back process for tuning the etch selectivity and includes gases such as $N_2$, $O_2$, $CO_2$, $SO_2$, CO, $SiCl_4$, or the like. The third precursor includes but is not limited to gases such as Ar, He, Ne, or the like. The concentrations of the first precursor, the second precursor, and the third precursor may be selected based on a desired selectivity of the materials of the first dummy gate material 119 (e.g., SiGe) and/or the materials of the fins 113 (e.g., Si).

The etch pull-back process may be performed using a plasma source power of between about 10 W and about 3,000 W (control ion/radical ratio), according to some embodiments. However, any suitable plasma source power may be utilized. Further, the etch pull-back process may be performed using a plasma bias power of between about 0 W and about 3,000 W. However, any suitable plasma bias power may be used. A direction of the plasma etch may be controlled. The plasma etch may be an isotropic etch or an anisotropic etch. According to some embodiments, the etch pull-back process may be performed at a process pressure of between about 1 mTorr and about 800 mTorr. However, any suitable pressure may be utilized. In some embodiments, the etch pull-back process may be performed using an etch gas with a process flow of between about 1 sccm and about 5,000 sccm. However, any suitable process flow may be utilized.

According to other embodiments, the etch pull-back process comprises a wet clean etch. The wet clean etch may be performed using first etchants (e.g., main chemicals) such as hydrofluoric acid (HF), fluorine ($F_2$), combinations, or the like. According to some embodiments, reactants may be added to assist in the chemical etching of certain materials and may be used for selective tuning of the wet clean etch. Reactants include but are not limited to compounds such as $H_2SO_4$, HCl, HBr, $NH_3$, combinations, or the like. In some embodiments, solvents may be used to provide the etchant as a solution for the wet clean etch. Solvents include but are not limited to de-ionized water (e.g., DI water), alcohol, acetone, combinations, or the like.

FIG. 5C illustrates the etch pull-back process in the top down view. In particular, FIG. 5C illustrates the third distance Dist3 of the recesses formed in the first dummy gate material 119. The formation of the openings 201 and the etch pull-back process allows for a large space for the source/drain regions to be formed without channel-channel restrictions, thereby increasing the dummy gate residue defect window. As such, the large dummy gate residue defect window enables increased etch capability with a smaller risk of defects (e.g., metal gate shorts) due to dummy gate material residue being left behind.

Figures 6A, 6B:
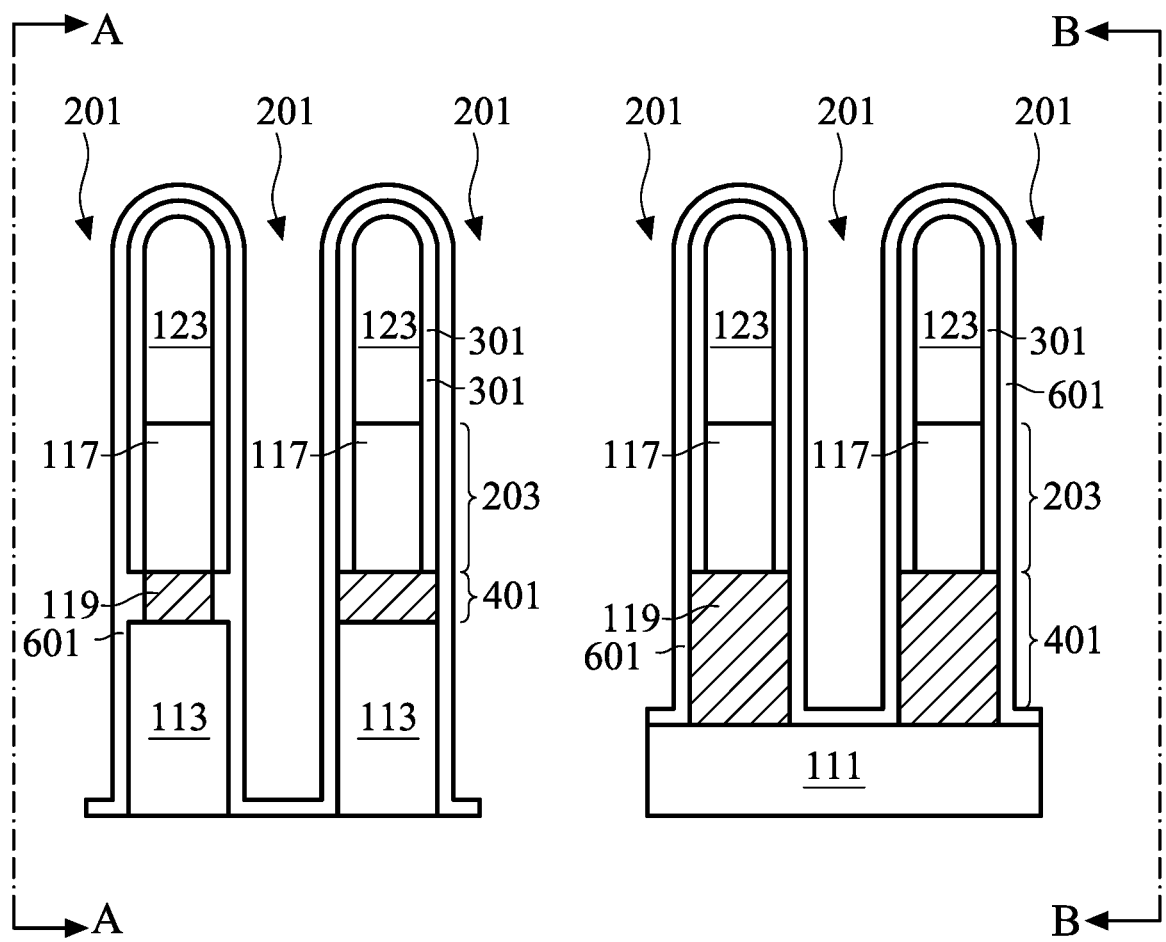

Turning to FIGS. 6A and 6B, these figures illustrate cross-sectional views along the first cutline A-A and second cutline B-B and additionally illustrate the beginning of a formation of a bottom spacer 601 adjacent to the top spacer 301, the first dummy gate material 119, the fins 113, and over the exposed surfaces of the substrate 101 (not shown in FIGS. 6A and 6B) and the isolation regions 111. The bottom spacers 601 may comprise one material layer (e.g., a single film) or may comprise multiple material layers (e.g., multiple films) such as two films, three films, or even as many as up to ten films. The bottom spacers 601 may be formed using any of the materials and any of the processes suitable for forming the top spacers 301. In some embodiments, the material selected for the bottom spacers 601 is different from the material selected for the top spacers 301, although the materials may also be the same. For example, in an embodiment in which the top spacers 301 are silicon nitride (SiN), the bottom spacers 601 may be silicon oxynitride (SiON). However, any suitable materials may be used.

During deposition, the materials of the bottom spacer 601 fill in the recesses at the bottom portions 401 of the dummy gate electrodes 117. According to some embodiments, the material of the bottom spacer 601 may be formed to a first thickness Th1 of between about 5 Å and about 500 Å over the top spacer 301 and formed to a second thickness Th2 of between about 8 Å and about 1000 Å within the recesses. However, any suitable material, thickness, and method of formation may be utilized.

Figures 7A, 7B:
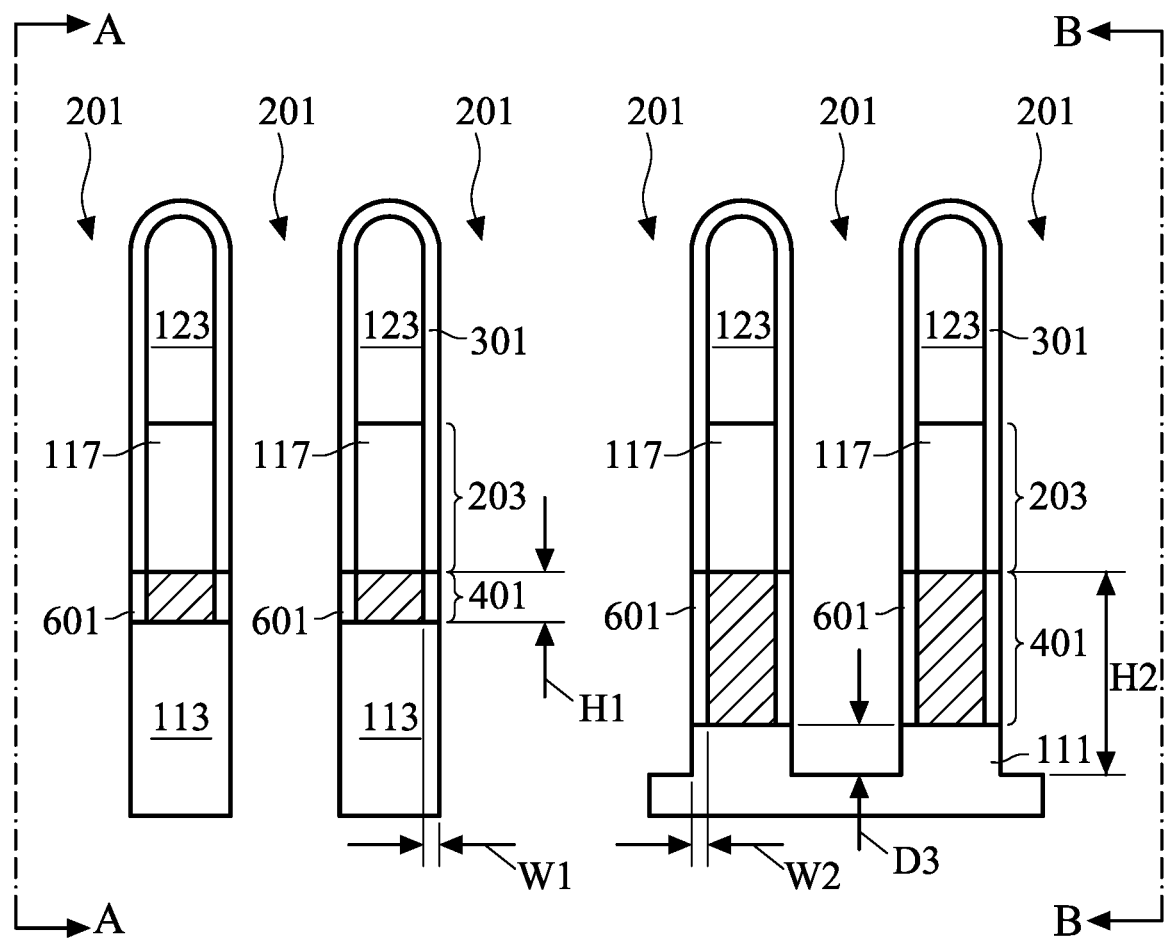

FIGS. 7A and 7B illustrate cross-sectional views along the first cutline A-A and second cutline B-B and additionally illustrate an etching of the material of the bottom spacers 601, the isolation regions 111, and/or the substrate 101 (not shown in FIGS. 7A and 7B). Once the materials for the bottom spacers 601 have been formed, the material of the bottom spacers 601 may be patterned to form the bottom spacers 601. In an embodiment the material of the bottom spacers 601 are patterned using one or more anisotropic etching processes, such as reactive ion etches, in order to remove the bottom spacers 601 from the horizontal surfaces of the structure. However, any suitable patterning process may be utilized.

According to some embodiments, the bottom spacers 601 may be patterned to a first height H1 and a first width W1 over the fins 113. In some embodiments, the first height H1 may be between about 3 Å and about 2,000 Å and the first width W1 may be between about 3 Å and about 500 Å. However, any suitable height and width may be utilized. Furthermore, in accordance with some embodiments, the bottom spacers 601 may be patterned to a second height H2 and a second width W2 over the isolation regions 111. In some embodiments, the second height H2 may be between about 3 Å and about 2,000 Å and the second width W2 may be between about 3 Å and about 500 Å. However, any suitable height and width may be used.

In an embodiment the patterning process of one or more anisotropic etching processes that are used to remove the bottom spacers 601 from the horizontal surfaces of the structure may also be used to recess portions of the isolation regions 111 that are exposed by the patterning process. As such, the isolation regions 111 that are not covered by the dummy gate electrodes 117 and the bottom spacers 601 may be recessed to a third depth D3 that is below the portion of the isolation regions 111 that is covered, thereby extending the openings 201 into the isolation regions 111. According to some embodiments, the isolation regions 111 may be recessed to the third depth D3 of between about 0.5 nm and about 50 nm. However, in other embodiments, the isolation regions 111 are not recessed, and any suitable patterning of the isolation regions 111 is fully intended to be included within the scope of the embodiments.

Figures 8A, 8B:
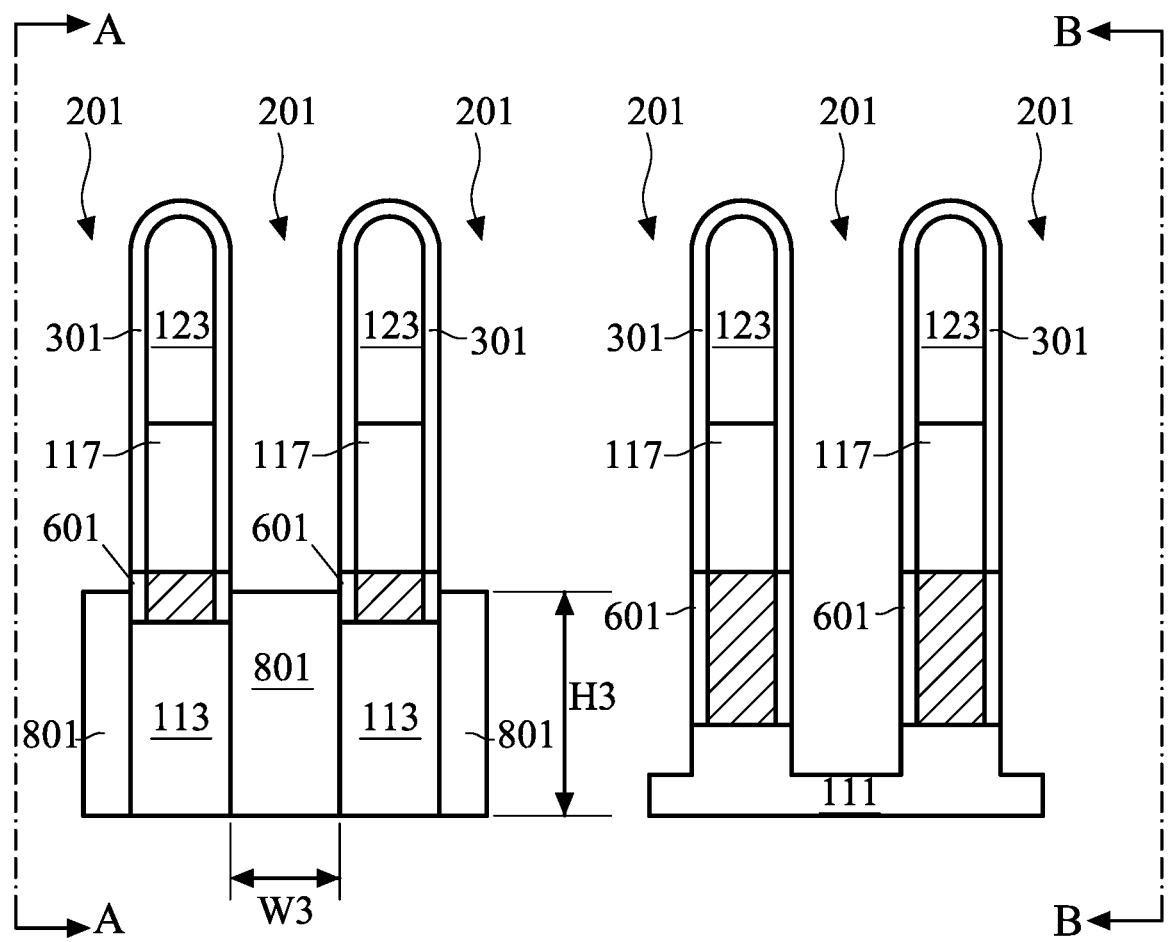

FIGS. 8A and 8B illustrate cross-sectional views along the first cutline A-A and second cutline B-B and additionally illustrate the formation of source/drain regions 801, in accordance with some embodiments. Once the openings 201 have been extended to remove the portions of the fins 113, the source/drain regions 801 may be formed in contact with each of the fins 113. In an embodiment the source/drain regions 801 may be formed and, in some embodiments the source/drain regions 801 may be formed to form a stressor that will impart a stress to the channel regions of the fins 113 located underneath the dummy gate electrodes 117. In an embodiment wherein the fins 113 comprise silicon and the FinFET is a p-type device, the source/drain regions 801 may be formed through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes.

In an embodiment the source/drain regions 801 may be formed to have a third height H3 of between about 5 Å and about 1000 Å. Furthermore, the source/drain regions 801 may be formed to have a third width W3 of between about 50 Å and about 10,000 Å, according to some embodiments. However, any suitable height and width may be used. However, any suitable height may be used. Although embodiments illustrated show the tops of the source/drain regions 801 being below the tops of the bottom spacers 601, the source/drain regions 801 may also be above the tops of the bottom spacers 601 and such embodiments are fully intended to be included within the scope of the present embodiments.

Once the source/drain regions 801 are formed, dopants may be implanted into the source/drain regions 801 by implanting appropriate dopants to complement the dopants in the fins 113. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy gate electrodes 117, the top spacers 301 and the bottom spacers 601 as masks. It should be noted that one of ordinary skill in the art will realize that many other processes, steps, or the like may be used to implant the dopants. For example, one of ordinary skill in the art will realize that a plurality of implants may be performed using various combinations of spacers and liners, or even an in-situ implantation during formation, to form source/drain regions having a specific shape or characteristic suitable for a particular purpose. Any of these processes may be used to implant the dopants, and the above description is not meant to limit the present embodiments to the steps presented above.

Figures 8C, 8D:
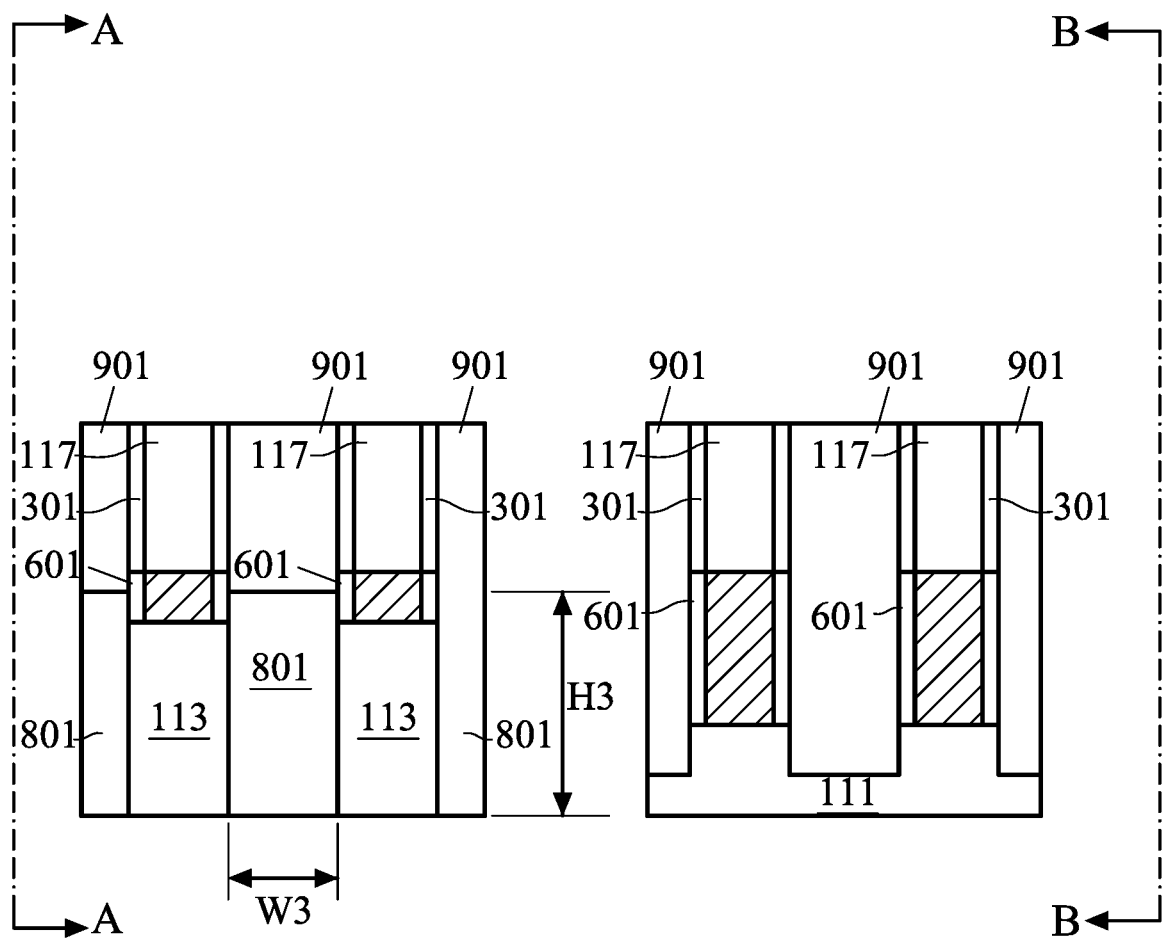

FIGS. 8C to 8D illustrate cross-sectional views along the first cutline A-A and the second cutline B-B, respectively, and further illustrate the formation of an inter-layer dielectric layer 901 and the replacement of the dummy gate electrodes 117 with gate stacks 903, with FIG. 8C corresponding to the structure of FIG. 8A and FIG. 8D corresponding to the structure of FIG. 8B. Once the source/drain regions 801 have been formed, a blanket deposition of a contact etch stop layer (not shown) is formed over the exposed surfaces of the source/drain regions 801, the bottom spacers 601, the top spacers 301, and the isolation regions 111 of the structures in FIGS. 8A and 8B. The contact etch stop layer is used to protect the underlying structures from damage caused by further processing and provide for a control point for further etching processes. In one embodiment, the contact etch stop layer may be formed of silicon nitride using plasma enhanced chemical vapor deposition (PECVD), although other materials such as nitride, oxynitride, carbide, boride, combinations thereof, or the like, and alternative techniques of forming the contact etch stop layer, such as low pressure CVD (LPCVD), PVD, or the like, could alternatively be used. The contact etch stop layer may have a thickness of between about 50 Å and about 2,000 Å.

Once the contact etch stop layer has been formed, an inter-layer dielectric layer 901 is deposited over the contact etch stop layer, according to some embodiments. The inter-layer dielectric layer 901 may comprise a material such as boron phosphorous silicate glass (BPSG), although any suitable dielectrics may be used. The inter-layer dielectric layer 901 may be formed using a process such as PECVD, although other processes, such as LPCVD, may alternatively be used. The inter-layer dielectric layer 901 may be formed to a thickness of between about 100 Å and about 3,000 Å. However, any suitable thickness may be used.

Once formed, the inter-layer dielectric layer 901 and the contact etch stop layer may be planarized with the top spacers 301 and the dummy gate electrode 117. In an embodiment, the inter-layer dielectric layer 901, the contact etch stop layer and the top spacers 301 may be planarized using, e.g., a planarization process such as chemical mechanical polishing process, although any suitable process may be utilized. In some embodiments, the planarization process may be utilized to remove the gate masks 123 and expose the dummy gate electrodes 117.

Figures 9A, 9B:
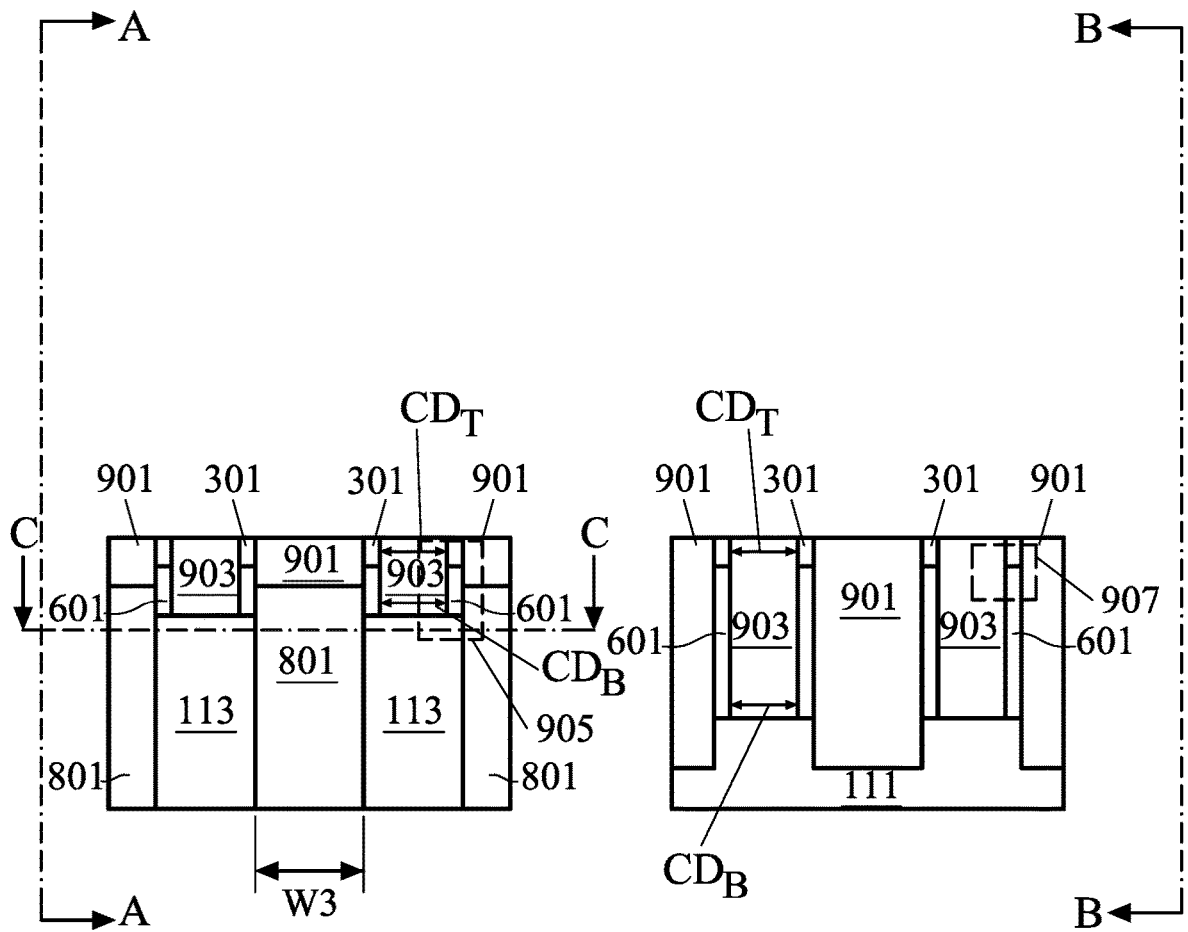
FIGS. 9A to 9E illustrate the removal of the dummy gate electrode and formation of gate electrode stacks in place of the dummy gate electrodes, in accordance with some embodiments.

FIGS. 9A-9B illustrate that, once the dummy gate electrodes 117 have been exposed, the dummy gate electrode 117 and underlying dummy gate dielectric 115 may be removed. According to some embodiments, the dummy gate electrodes 117 and the dummy gate dielectric 115 are removed using, e.g., one or more wet or dry etching processes that utilize etchants that are selective to the materials of the dummy gate electrode 117 and/or the dummy gate dielectric 115 but not the materials of the underlying fins 113 (e.g., channel regions). However, any suitable removal process or processes may be utilized.

During removal of the dummy gate electrode 117 or, for example, in a gate-oxide removal step after removal of the dummy gate electrode 117, the etching processes may remove some of the materials of the top spacers 301 and/or the bottom spacers 601. As such, the thicknesses of the top spacers 301 and/or the bottom spacers 601 may be reduced from their original thicknesses (e.g., the third distance Dist3). Furthermore, based on differences in etch rates between the materials of the top spacers 301 and the bottom spacers 601 and based on the selectivity of the etchants used to remove the dummy gate electrode 117, the thicknesses of the top spacers 301 may be reduced further than the thicknesses of the bottom spacers 601. However, in other embodiments, the thickness of the bottom spacers 601 may also be reduced further than the thicknesses of the top spacers 301, the thicknesses may be reduced a same amount, or the thicknesses may not be reduced from their original thicknesses (e.g., the third distance Dist3 as shown in FIG. 5C). According to the embodiment illustrated in FIGS. 9A-9E, the thicknesses of the top spacers 301 and the bottom spacers 601 are not reduced from their original thicknesses (e.g., the third distance Dist3).

Once the channel regions of the fins 113 have been exposed, the gate stacks 903 may be formed. In an embodiment the gate stacks 903 may be formed by initially depositing a series of layers. In an embodiment the series of layers may include an interfacial layer, a first gate dielectric material, a first metal material, and a first p-metal work function layer (each of which is not separately illustrated in FIGS. 9A and 9B for clarity).

Optionally, the interfacial layer may be formed prior to the formation of the first gate dielectric material. In an embodiment the interfacial layer may be a material such as silicon dioxide formed through a process such as in situ steam generation (ISSG) or a deposition process such as chemical vapor deposition or atomic layer deposition. In another embodiment the interfacial layer may be a high-k material such as $HfO_2$, HfSiO, HfSiON, HfTaO, HfTiO, HfZrO, LaO, ZrO, $Ta_2O_5$, combinations of these, or the like, to a first thickness of between about 5 Å and about 20 Å. In embodiments which utilize a deposition process, the interfacial layer may be formed conformably, while in embodiments in which ISSG is utilized the interfacial layer may be formed along the bottom of the opening without extending along the sidewalls.

Once the interfacial layer is formed, the first gate dielectric material may be formed as a capping layer over the interfacial layer. In an embodiment the first gate dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first gate dielectric material may be deposited to a second thickness of between about 5 Å and about 200 Å, although any suitable material and thickness may be utilized.

Optionally, the first metal material or metal gate capping layer may be formed adjacent to the first gate dielectric material as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a third thickness of between about 5 Å and about 200 Å, although any suitable deposition process or thickness may be used.

The first p-metal work function layer may be formed adjacent to the first metal material and, in a particular embodiment, may be similar to the first metal material. For example, the first p-metal work function layer may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer may be deposited using a deposition process such as atomic layer deposition, chemical vapor deposition, sputtering, or the like, to a fourth thickness of between about 5 Å and about 500 Å, although any suitable deposition process or thickness may be used.

Once the first p-metal work function layer has been formed, a first n-metal work function layer may be deposited. In an embodiment, the first n-metal work function layer may be a material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like, to a sixth thickness of between about 5 Å and about 5000 Å. However, any suitable materials and processes may be utilized to form the first n-metal work function layer.

Within the gate stacks 903, a glue layer and a fill material are also deposited. Once the first n-metal work function layer has been formed, the glue layer may be formed in order to help adhere the overlying fill material with the underlying first n-metal work function layer as well as provide a nucleation layer for the formation of the fill material. In an embodiment the glue layer may be a material such as titanium nitride or else may be a material similar to the first n-metal work function layer and may be formed using a similar process such as ALD to a seventh thickness of between about 10 Å and about 100 Å. However, any suitable materials and processes may be utilized.

Once the glue layer has been formed, the fill material is deposited to fill a remainder of the opening using the glue layer. In an embodiment the fill material may be a material such as tungsten, Al, Cu, AlCu, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material may be deposited to a thickness of between about 1000 Å and about 2000 Å. However, any suitable material may be utilized.

FIGS. 9A and 9B further illustrate that, after the fill material has been deposited to fill and overfill the opening, the materials may be planarized to form the gate stacks 903. In an embodiment the materials may be planarized using, e.g., a chemical mechanical polishing process, although any suitable process, such as grinding or etching, may be utilized. While not explicitly shown for clarity, the interfacial layer may be planar along a bottom surface of the gate stacks 903; the first gate dielectric material, the first metal material, the first p-metal work function layer, the first n-metal work function layer, the glue layer and the fill material may fill a remainder of the space of the gate stacks 903. FIG. 9A further highlights a first section 905 of the structure along the first cutline A-A and FIG. 9B further highlights a second section 907 of the structure along the second cutline B-B. The first section 905 and the second section 907 are referenced in the discussion below with respect to FIGS. 9D and 9E.

Figure 9C:
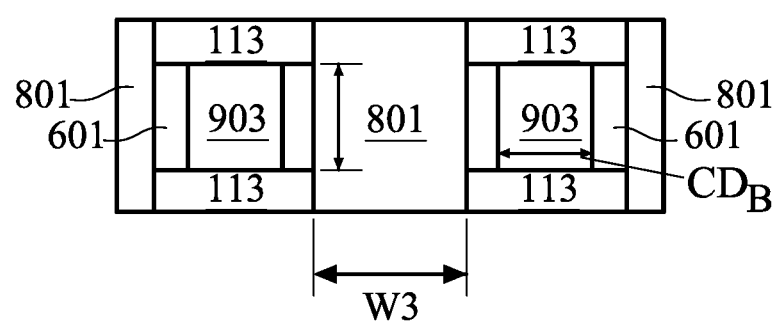

FIGS. 9A-9C further illustrate a bottom portion critical dimension ($CD_B$) and a top portion critical dimension ($CD_T$) of the gate stack 903. The bottom portion critical dimension ($CD_B$) is a distance between the bottom spacers 601 separated by the gate stack 903 and the top portion critical dimension ($CD_T$) is a distance between the top spacers 301 separated by the gate stack 903. According to some embodiments, the top portion critical dimension ($CD_T$) may be about the same distance as the bottom portion critical dimension ($CD_B$) such as a distance of between about 1 nm and about 500 nm. However any suitable distance may be used. FIG. 9C illustrates the formation of the gate stacks 903 in the top down view. In particular, FIG. 9C illustrates the formation of the gate stacks 903 between the two adjacent ones of the fins 113 and between the bottom spacers 601.

Figure 9D:
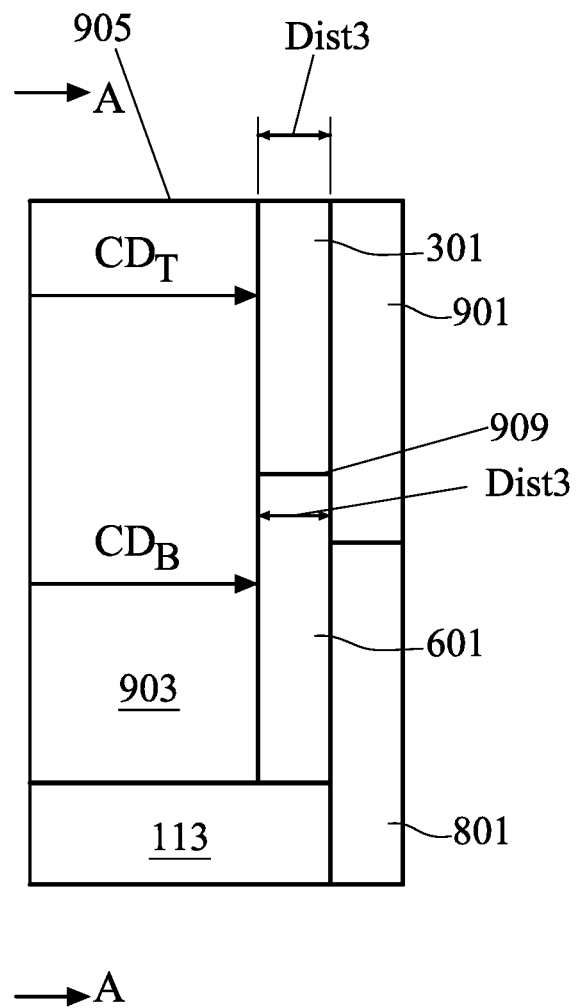
Figure 9E:
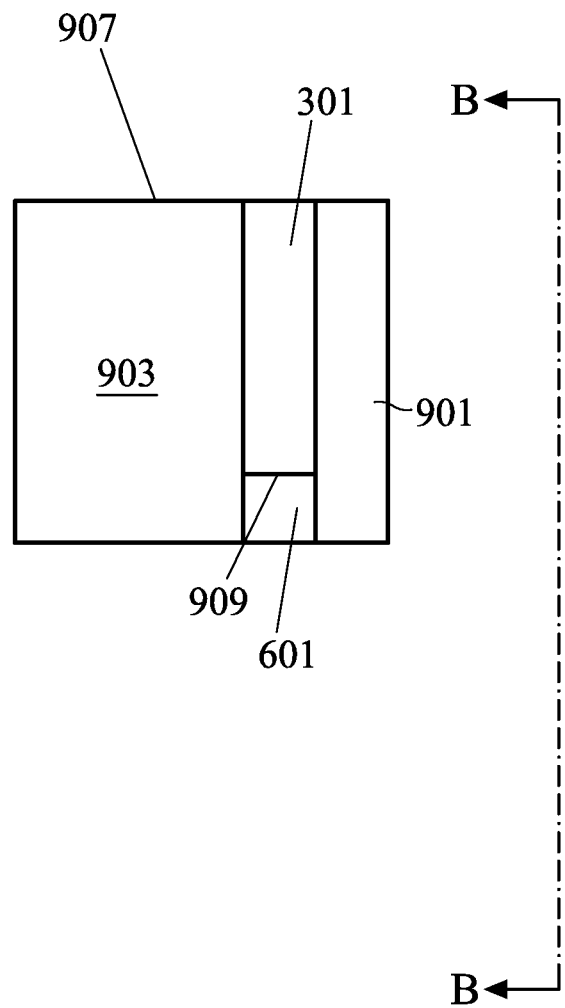

FIG. 9D illustrates a magnified view of the first section 905 highlighted in FIG. 9A and FIG. 9E illustrates a magnified view of the second section 907 highlighted in FIG. 9B. In particular, FIGS. 9D and 9E further illustrate certain features of the gate stacks 903, the top spacers 301, and the bottom spacers 601 of an embodiment in which the top portion critical dimension $CD_T$ of the gate stack 903 and the bottom portion critical dimension $CD_B$ are about equal distances.

According to some embodiments, the top spacers 301 intersect with the bottom spacers 601 at spacer interfaces 909. According to some embodiments, the spacer interfaces 909 have lengths that are about equal to the third distance Dist3. In some embodiments, the spacer interfaces 909 are located above a level of the tops of the source/drain regions 801, although they may also be located at or below the level of the tops of the source/drain regions 801.

FIG. 9D further illustrates that the bottom spacers 601 are located adjacent to the gate stacks 903 and adjacent to the tops of the channel regions (e.g., the fins 113). The interfaces between the bottom spacers 601 and the gate stacks 903 and the interfaces between the bottom spacers 601 and the channel regions form a first angle θ'. According to some embodiments, the first angle θ' is about 90°, such as within a range between about 60° and about 120°.

Figure 10A:
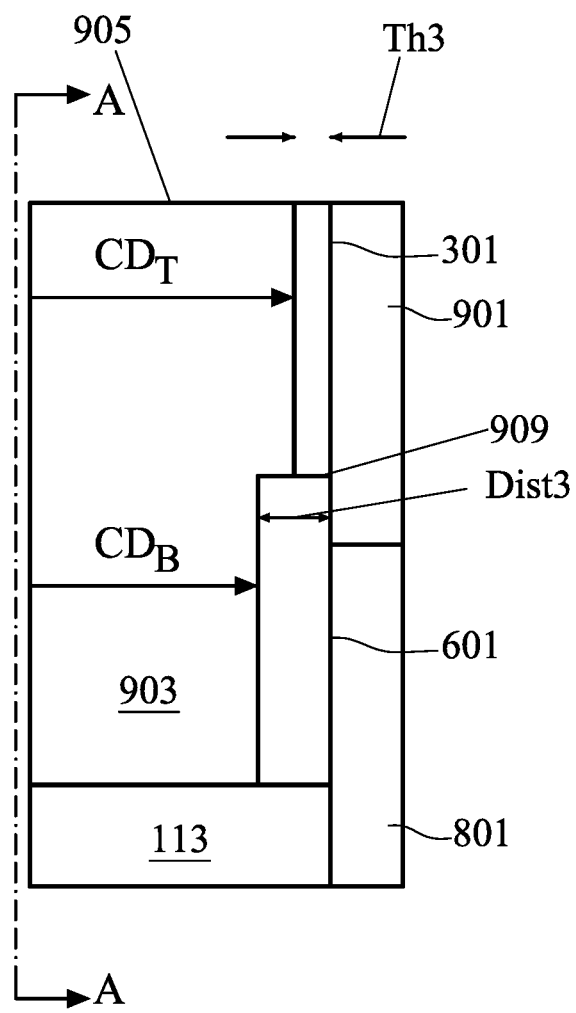
Figure 10B:
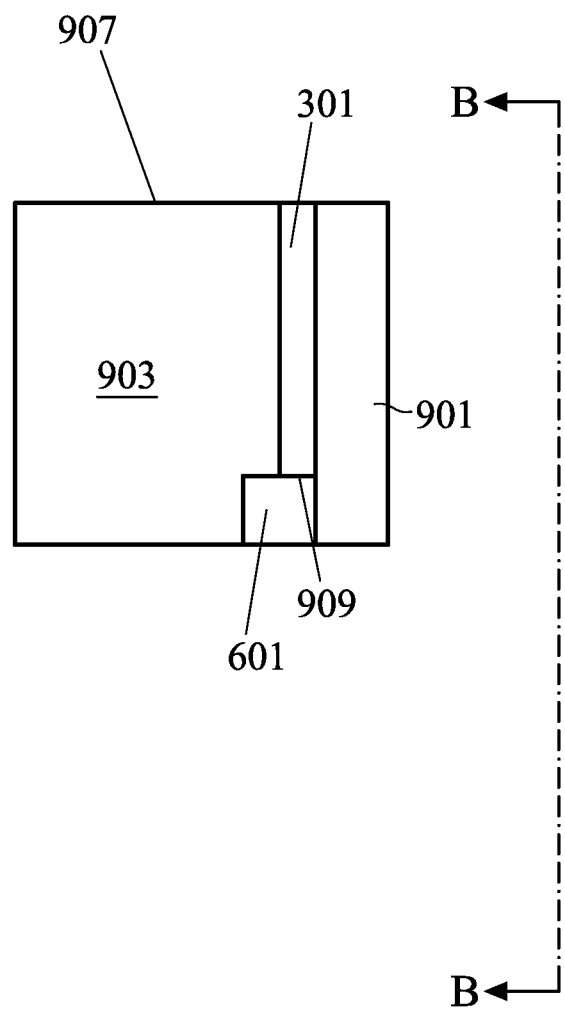

Turning to FIGS. 10A and 10B, according to some other embodiments, these figures illustrate magnified views of the first section 905 highlighted in FIG. 9A and the second section 907 highlighted in FIG. 9B, respectively. In particular, FIGS. 10A and 10B illustrate certain features of the gate stacks 903, the top spacers 301, and the bottom spacers 601 of another embodiment in which the top portion critical dimension $CD_T$ of the gate stacks 903 are greater than the bottom portion critical dimension $CD_B$ of the gate stacks 903.

According to some embodiments, the top spacers 301 comprise the single film of the first dielectric material (e.g., SiN) and the bottom spacers 601 comprise a single film of a second dielectric material, which may be any material as described above with respect to the first dielectric material (e.g., SiON), and wherein the first dielectric material has a first etch rate that is greater than a second etch rate of the second dielectric material. During the removal of the dummy gate electrode 117 and/or the removal of the dummy gate dielectric 115, the thicknesses of the top spacers 301 are reduced to a third thickness Th3 of between about 0.3 nm and about 49.8 nm and the thicknesses of the bottom spacers 601 are not reduced (or are only minimally reduced) from their original thicknesses (e.g., the third distance Dist3). As such, the top portion critical dimension $CD_T$ of the gate stacks 903 is greater than the bottom portion critical dimension $CD_B$ of the gate stacks 903. According to some embodiments, the top portion critical dimension $CD_T$ may be between about 1.4 nm and about 1000 nm and the bottom portion critical dimension $CD_B$ may be between about 1 nm and about 1000 nm. However, any suitable dimensions may be used. Furthermore, the length of the spacer interfaces 909 is reduced to the third thickness Th3 and the tops of the bottom spacers 601 interface with both the top spacers 301 and the gate stacks 903.

Figure 11A:
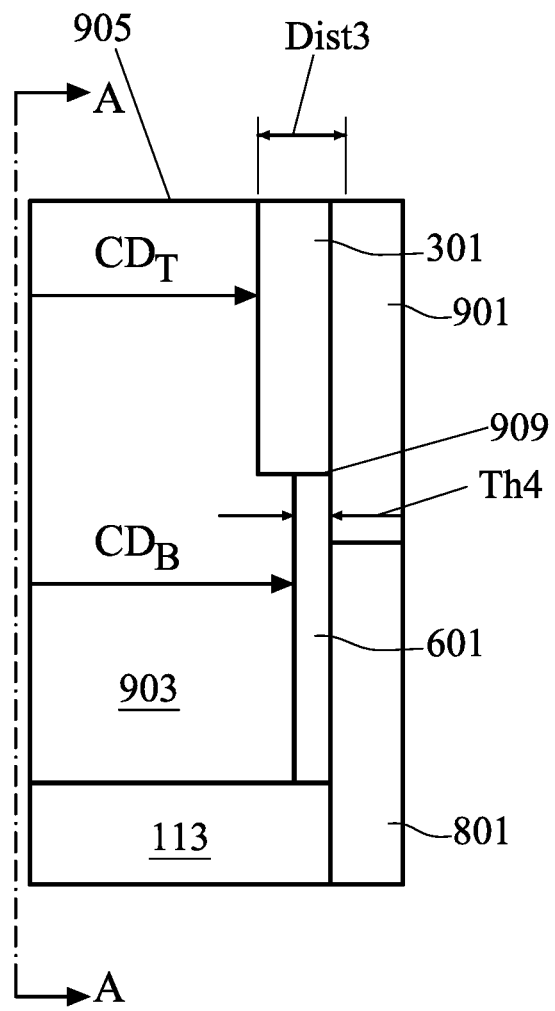
Figure 11B:
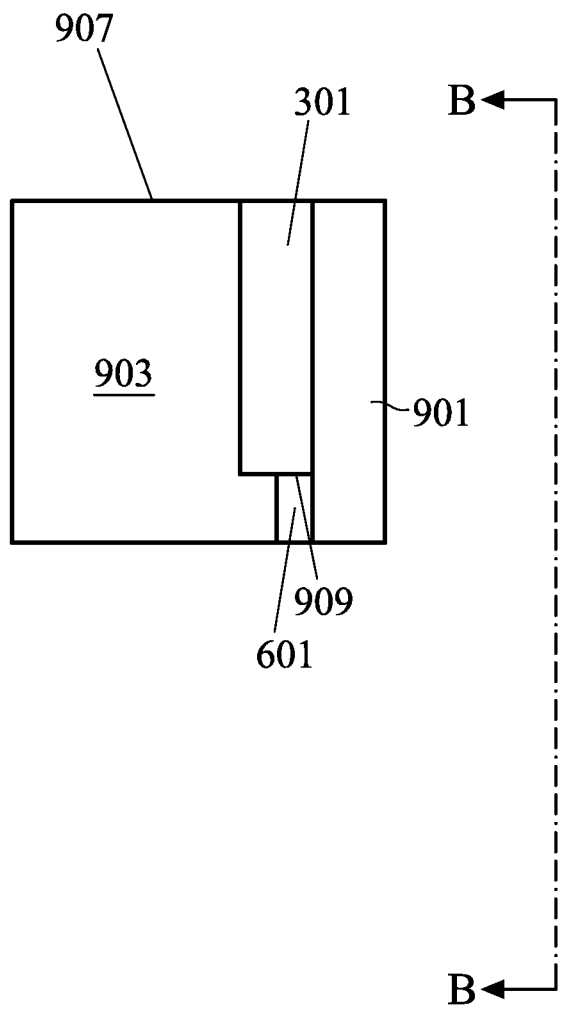

Continuing to FIGS. 11A and 11B, according to still other embodiments, these figures illustrate magnified views of the first section 905 highlighted in FIG. 9A and the second section 907 highlighted in FIG. 9B, respectively. In particular, FIGS. 11A and 11B illustrate certain features of the gate stacks 903, the top spacers 301, and the bottom spacers 601 of yet another embodiment in which the bottom portion critical dimension $CD_B$ of the gate stacks 903 are greater than the top portion critical dimension $CD_T$ of the gate stacks 903.

According to some embodiments, the top spacers 301 comprise a single film of the first dielectric material (e.g., SiOCN) and the bottom spacers 601 comprise a single film of the second dielectric material (e.g., SiC), wherein the second dielectric material has a fourth etch rate that is greater than a third etch rate of the first dielectric material. During the removal of the dummy gate electrode 117 and/or the removal of the dummy gate dielectric 115, the thicknesses of the bottom spacers 601 are reduced to a fourth thickness Th4 of between about 0.3 nm and about 49.8 nm and the thicknesses of the top spacers 301 are not reduced (or are only minimally reduced) from their original thicknesses (e.g., the third distance Dist3). As such, the bottom portion critical dimension $CD_B$ of the gate stacks 903 is greater than the top portion critical dimension $CD_T$ of the gate stacks 903. According to some embodiments, the bottom portion critical dimension $CD_B$ may be between about 1.4 nm and about 1000 nm and the top portion critical dimension $CD_T$ may be between about 1.0 nm and about 1000 nm. However, any suitable dimensions may be used. Furthermore, the length of the spacer interfaces 909 is reduced to the fourth thickness Th4 and the bottoms of the top spacers 301 interface with both the bottom spacers 601 and the gate stacks 903.

Figure 12A:
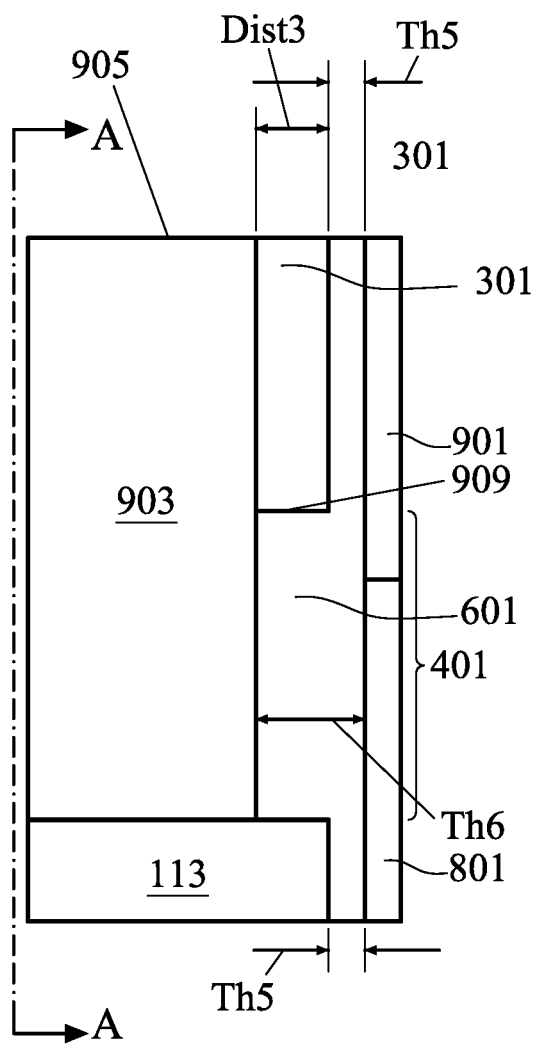
Figure 12B:
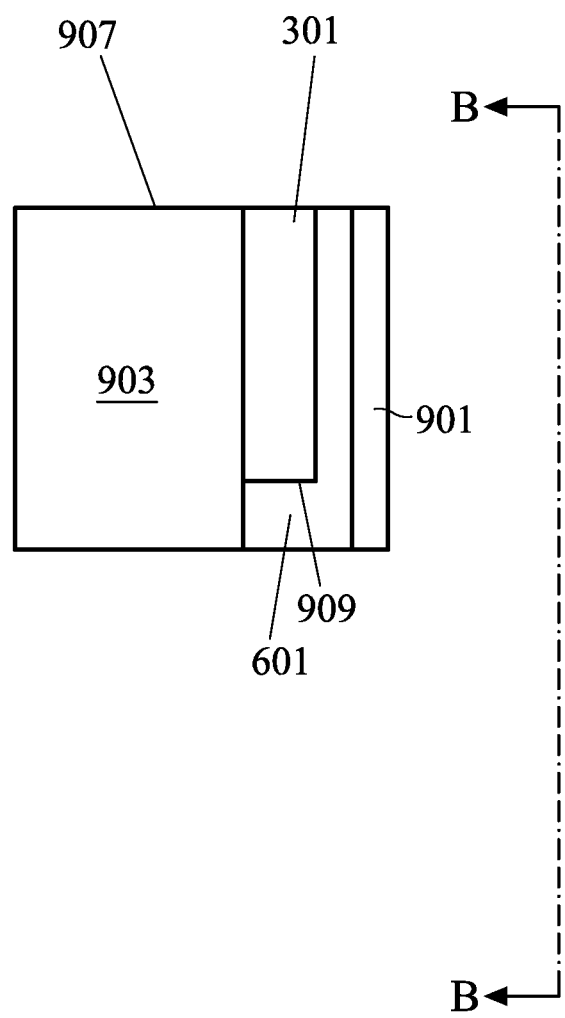

With reference now to FIGS. 12A and 12B according to some further embodiments, these figures illustrate magnified views of the first section 905 highlighted in FIG. 9A and the second section 907 highlighted in FIG. 9B, respectively. In particular, FIGS. 12A and 12B illustrate certain features of the gate stacks 903, the top spacers 301, and the bottom spacers 601 of still further embodiments in which a portion of the spacer material used to form the bottom spacers 601 is retained during the etching process (see, e.g., FIGS. 6A-7B) adjacent the outer sidewalls of the top spacers 301 and the sidewalls of the fins 113.

According to some embodiments, the material of the bottom spacers 601 may be removed from the horizontal surfaces of the top spacers 301, the substrate 101, and the isolation regions 111 as discussed in regards to FIGS. 6A to 7B. However, the material of the bottom spacers 601 formed along the vertical surfaces in these figures may be removed to a lesser degree. As such, the remaining portions of the material of the bottom spacers 601 may be reduced from the original thickness along the sidewalls from the first thickness Th1 (shown in FIGS. 6A and 6B) to a fifth thickness Th5. Furthermore, the material of the bottom spacers 601 may be reduced in the recesses at the bottom portions 401 of the dummy gate electrodes 117 from the second thickness Th2 (shown in FIGS. 6A and 6B) to a sixth thickness Th6. According to some embodiments, the fifth thickness Th5 may be between about 0.3 nm and about 50 nm and the sixth thickness Th6 may be between about 0.6 nm and about 100 nm. However, any suitable thicknesses may be used.

FIGS. 12A and 12B further illustrate that the spacer interfaces 909 between the bottom spacers 601 and the top spacers 301 form a backwards "L-shape" along the bottom surfaces and outer sidewall surfaces of the top spacers 301. The bottom spacers 601 may also form interfaces with the fins 113 that are shaped as an upside down backwards "L-shape" along the top surfaces and the outer sidewalls of the fins 113.

Figure 13A:
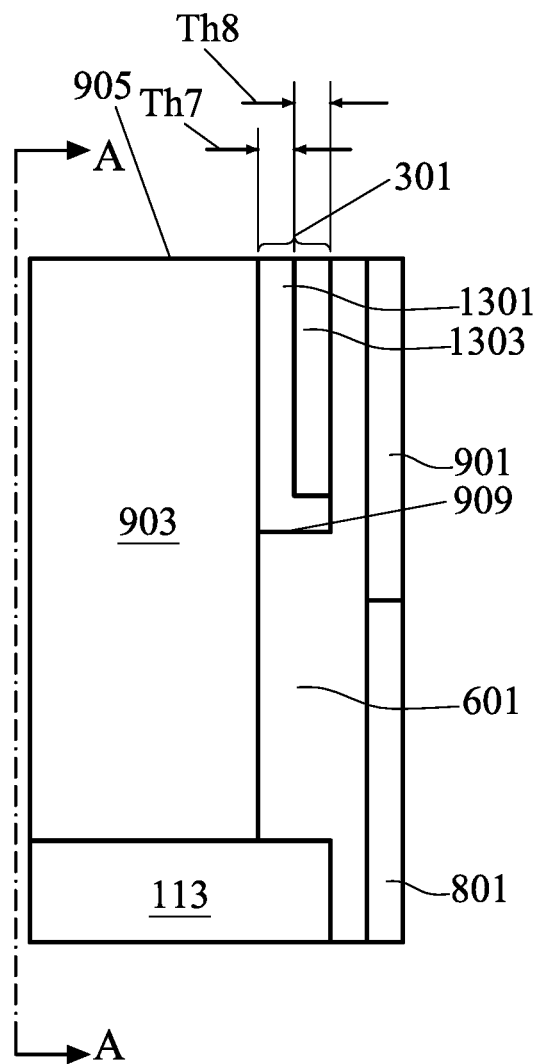
Figure 13B:
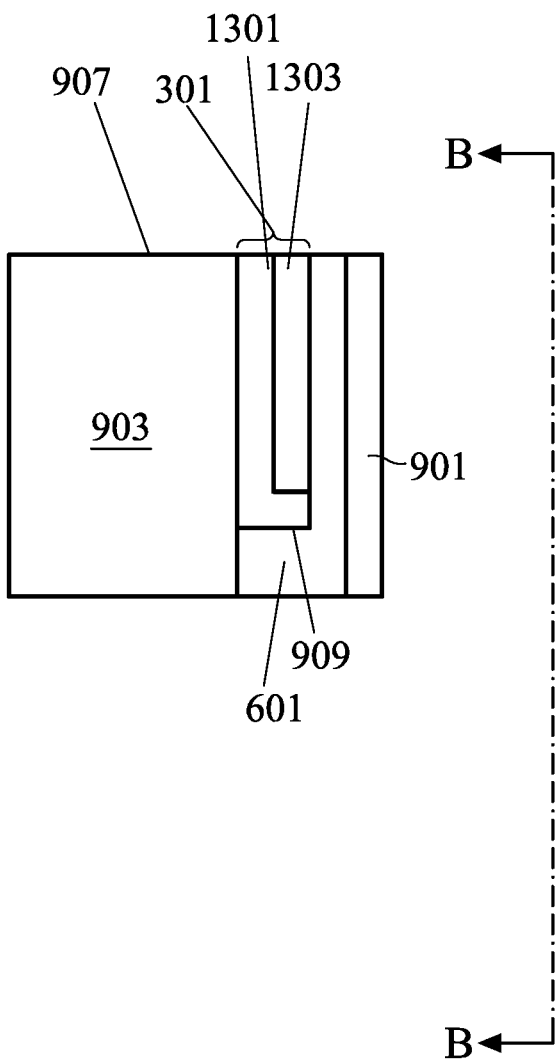

Turning to FIGS. 13A and 13B, according to still other embodiments, these figures illustrate magnified views of the first section 905 and the second section 907 similar to those of FIGS. 12A and 12B, respectively. In particular, FIGS. 13A and 13B illustrate certain features of the gate stacks 903, the top spacers 301, and the bottom spacers 601 of still further embodiments in which the top spacers 301 comprise multiple films.

According to some embodiments, the top spacers 301 comprise a first dielectric film 1301 and a second dielectric film 1303. The first dielectric film 1301 may comprise the first dielectric material (e.g., SiN) and the second dielectric film 1303 may comprise the second dielectric material (e.g., SiOCN). According to some embodiments, the first dielectric film 1301 may be deposited to a seventh thickness Th7 of between about 0.3 nm and about 50 nm, and the second dielectric film 1303 may be deposited over the first dielectric film 1301. However, any suitable thickness may be used.

Once the second dielectric film 1303 has been deposited, the openings 201 may be extended through the top spacers 301, the first dummy gate material 119 and the fins 113 as discussed above with regard to FIGS. 4A to 4C. As such, the first dielectric film 1301 may be formed with the spacer interface 909 and an "L-shape" that faces away from the gate stack 903 and the second dielectric film 1303 may be formed with an "I-shape." Additionally, the second dielectric film 1303 may be patterned to have an eighth thickness Th8 of between about 0.3 nm and about 50 nm. However, any suitable thickness may be used.

Figure 14A:
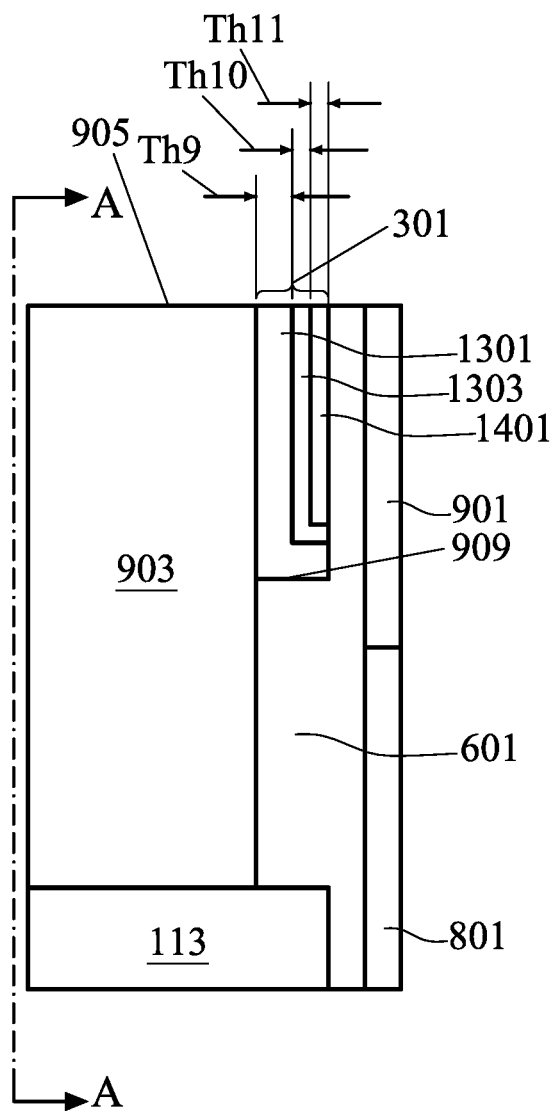
Figure 14B:
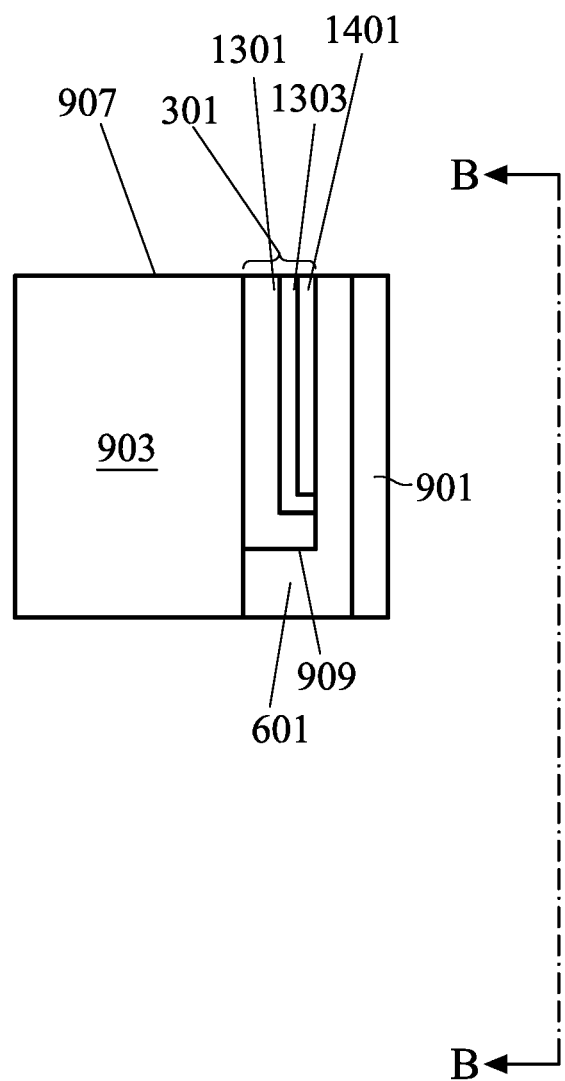

Turning to FIGS. 14A and 14B, according to yet further embodiments, these figures illustrate magnified views of the first section 905 and the second section 907 similar to those of FIGS. 13A and 13B, respectively. In particular, FIGS. 14A and 14B illustrate certain features of the gate stacks 903, the top spacers 301, and the bottom spacers 601 of still further embodiments in which the top spacers 301 comprise multiple dielectric films.

According to some embodiments, the top spacers 301 comprise the first dielectric film 1301, the second dielectric film 1303, and a third dielectric film 1401. The third dielectric film 1401 may comprise the first dielectric material (e.g., SiC). The third dielectric film 1401 may be blanket deposited over the second dielectric film 1303 using any of the materials and processes set forth above for forming the top spacers 301, as illustrated in FIGS. 3A and 3B. According to some embodiments, the first dielectric film 1301 may be deposited to an ninth thickness Th9 of between about 0.3 nm and about 50 nm and the second dielectric film 1303 may be deposited to a tenth thickness Th10 of between about 0.3 nm and about 50 nm, in accordance with some embodiments.

Once the third dielectric film 1401 has been deposited, the openings 201 may be extended through the top spacers 301, the first dummy gate material 119 and the fins 113 as discussed above with regard to FIGS. 4A to 4C. As such, the first dielectric film 1301 may be formed with the spacer interface 909. Furthermore, the first dielectric film 1301 and the second dielectric film 1303 may both be formed with "L-shapes" that face away from the gate stack 903 and the third dielectric film 1401 may be formed with an "I-shape." Additionally, once the third dielectric film 1401 has been deposited and patterned, the third dielectric film 1401 may have an eleventh thickness Th11 of between about 0.3 nm and about 50 nm. However, any suitable thicknesses may be used.

Figure 15A:
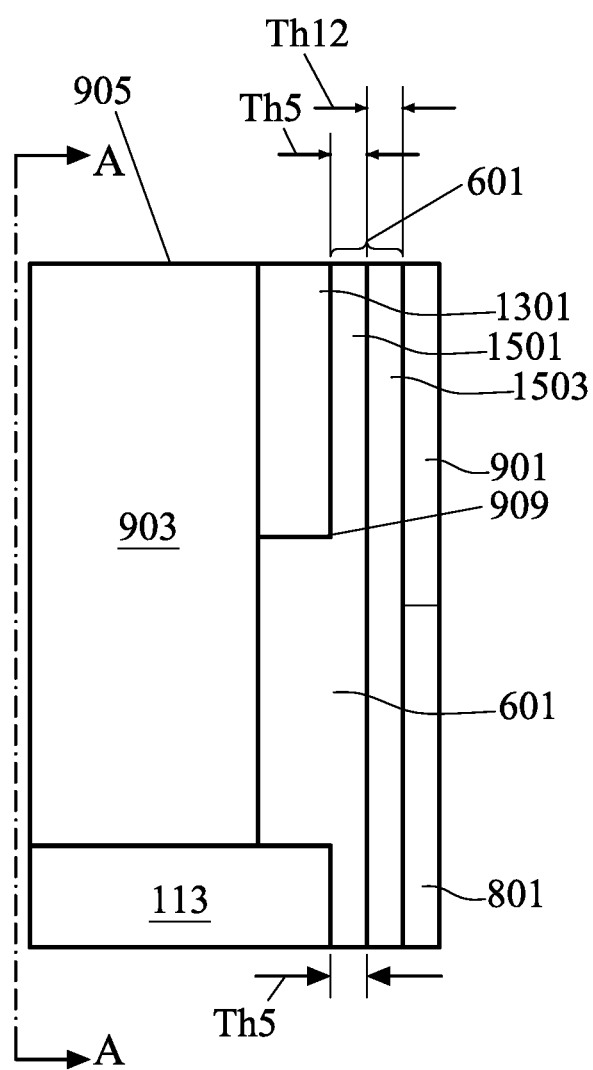
Figure 15B:
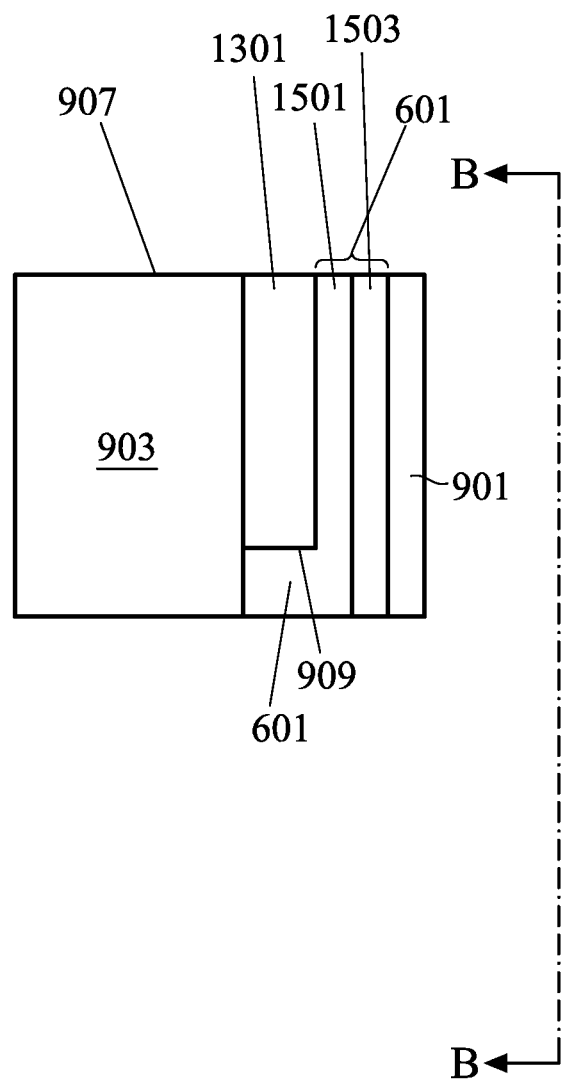

Turning to FIGS. 15A and 15B, according to still other embodiments, these figures illustrate magnified views of the first section 905 and the second section 907 similar to those of FIGS. 12A and 12B, respectively. In particular, FIGS. 15A and 15B illustrate certain features of the gate stacks 903, the top spacers 301, and the bottom spacers 601 of still further embodiments in which a portion of the spacer material used to form the bottom spacers 601 comprise multiple layers and is retained adjacent the outer sidewalls of the top spacers 301 and the sidewalls of the fins 113.

According to some embodiments, the bottom spacers 601 comprise a first dielectric layer 1501 and a second dielectric layer 1503. The first dielectric layer 1501 may comprise the first dielectric material (e.g., SiON) and the second dielectric layer 1503 may comprise the second dielectric material (e.g., SiOC). The first dielectric layer 1501 may be blanket deposited over the structure and the second dielectric layer 1503 may be blanket deposited over the first dielectric layer 1501 using any of the materials and processes set forth above for forming the bottom spacers 601, as illustrated in FIGS. 6A and 6B. According to some embodiments, the first dielectric layer 1501 may be deposited to the fifth thickness Th5, as discussed above.

Once the second dielectric layer 1503 has been deposited, the material of the bottom spacers 601 may be removed from the horizontal surfaces of the top spacers 301, the substrate 101, and the isolation regions 111 as discussed in regards to FIGS. 6A to 7B. However, the materials of bottom spacers 601 formed along the vertical surfaces of the structure may be removed to a lesser degree. FIGS. 15A and 15B further illustrate that the spacer interfaces 909 forms a backwards "L-shape" between the bottom surfaces and outer sidewall surfaces of the top spacers 301 and the first dielectric layer 1501. The first dielectric layer 1501 may also form interfaces with the fins 113 that are shaped as an upside down backwards "L-shape" along the top surfaces and the outer sidewalls of the fins 113. Furthermore, the second dielectric layer 1503 separates the inter-layer dielectric layer 901 and the source/drain regions 801 from the first dielectric layer 1501, according to some embodiments. Finally, the second dielectric layer 1503, after patterning, may have a twelfth thickness Th12 of between about 0.3 nm and about 50 nm, in accordance with some embodiments. However, any suitable thicknesses may be used.

Figure 16A:
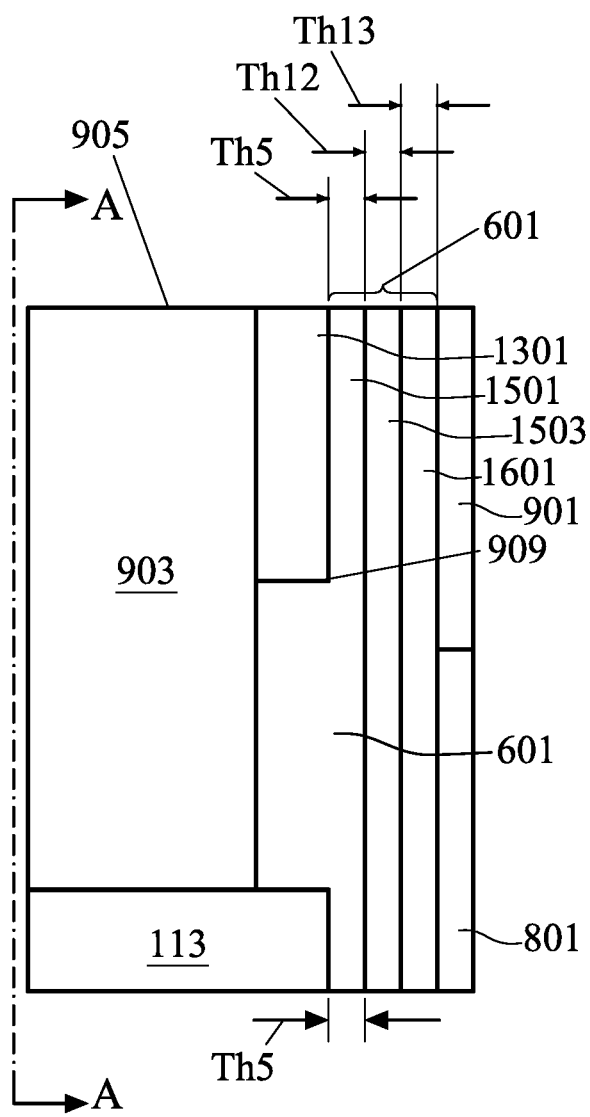
Figure 16B:
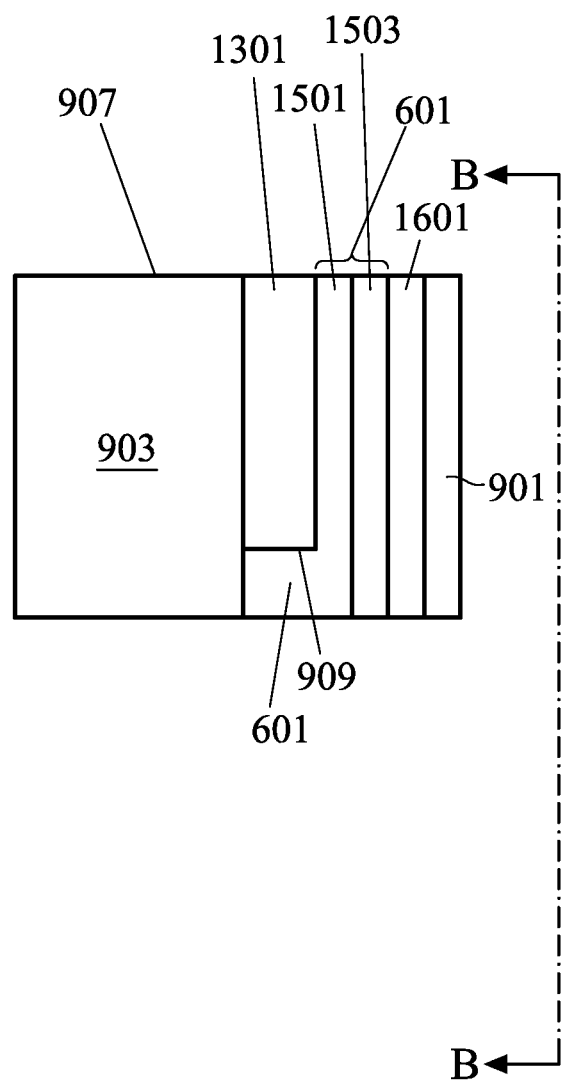

Continuing to FIGS. 16A and 16B, according to still further embodiments, these figures illustrate magnified views of the first section 905 and the second section 907 similar to those of FIGS. 15A and 15B, respectively. In particular, FIGS. 16A and 16B illustrate certain features of the gate stacks 903, the top spacers 301, and the bottom spacers 601 of still further embodiments in which a portion of the spacer material used to form the bottom spacers 601 comprise multiple layers and is retained adjacent the outer sidewalls of the top spacers 301 and the sidewalls of the fins 113.

In some embodiments, the bottom spacers 601 comprise the first dielectric layer 1501, the second dielectric layer 1503, and a third dielectric layer 1601. The third dielectric layer 1601 may be blanket deposited over the second dielectric layer 1503 using any of the materials and processes set forth above for forming the bottom spacers 601, as illustrated in FIGS. 6A and 6B. According to some embodiments, the third dielectric layer 1601 may be deposited using the first dielectric material (e.g., $SiO_2$).

Once the third dielectric layer 1601 has been deposited, the material of the bottom spacers 601 may be removed from the horizontal surfaces of the top spacers 301, the substrate 101, and the isolation regions 111 as discussed in regards to FIGS. 6A to 7B. However, the materials of bottom spacers 601 formed along the vertical surfaces of the structure may be removed to a lesser degree. FIGS. 16A and 16B further illustrate that the spacer interfaces 909 forms a backwards "L-shape" between the bottom surfaces and outer sidewall surfaces of the top spacers 301 and the first dielectric layer 1501. The first dielectric layer 1501 may also form interfaces with the fins 113 that are shaped as an upside down backwards "L-shape" along the top surfaces and the outer sidewalls of the fins 113. Furthermore, the third dielectric layer 1601 separates the inter-layer dielectric layer 901 and the source/drain regions 801 from the second dielectric layer 1503, according to some embodiments. Once patterned, the third dielectric layer 1601 may have a thirteenth thickness Th13 of between about 0.3 nm and about 50 nm, in accordance with some embodiments. However, any suitable thickness may be used.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

Additionally, although the embodiments described above have been described with regards to forming FinFET devices, the materials and processes described herein may be equally applied to other semiconductor devices such as gradient-channel device, multi-channel devices, combinations or the like are fully included within the scopes of the embodiments. For example, the formation of the fins 113 may be directed towards patterning the fins from compound material layer stacks (e.g., gradient compound materials, nanosheets, or the like). As such, gradient channel devices and/or multi-channel devices (e.g., nanosheet FETs (NSFETs), gate-all-around FETs (GAAFETs), or the like) may also be formed using the techniques and processes set forth above and are fully included within the scopes of the embodiments.

According to some embodiments, FinFET devices may be formed with gradient channels. The fins 113 may be formed as gradient channels from a gradient material layer formed over the substrate 101. The gradient material layer may comprise a first silicon-based gradient compound (e.g., SiGe$_{(low\ Ge\ \%)}$) with a relatively low percentage concentration of germanium to the percentage concentration of silicon in the gradient material layer. The fins 113 may be patterned using the techniques described above and isolation regions 111 are formed between the fins 113. Once the isolation regions 111 have been formed between the fins 113, the complex dummy gate material layer 125 is formed over the fins 113 and the isolation regions 111. The fins 113 may be patterned using the techniques described above and the complex dummy gate material layer 125 is formed over the fins 113. According to some embodiments, the first dummy gate material 119 of the complex dummy gate material layer 125 comprises a second silicon-based gradient compound with an etch rate that is greater than an etch rate of the fins 113. In some embodiments, the second silicon-based gradient compound comprises a material (e.g., SiGe$_{(high\ Ge\ \%)}$) with a relatively high percentage concentration of germanium to the percentage concentration of silicon. In some embodiments, the second dummy gate material 121 of the complex dummy gate material layer 125 comprises another silicon-based material (e.g., Si) and is initially patterned into the top portions 203 of the dummy gate electrodes 117 and then protected by the top spacer 301. As such, the techniques described above for extending the openings 201 to pattern the bottom portions 401 of the dummy gate electrodes 117 and to etch through the fins 113 may be equally applied to these embodiments. With the difference in etch rates between the first dummy gate material 119 and the material of the fins 113, damage to the tops of the fins 113 is prevented during the patterning of the dummy gate electrodes 117 and the etching through the fins 113.

In still other embodiments, multi-channel FET devices (e.g., nanosheet FETs (NSFETs), gate-all-around FETs (GAAFETs), or the like) are formed from a multi-layered stack of semiconductor materials formed over the substrate 101. According to some embodiments, the multi-layered stack comprises alternating nanosheets of first nanosheet material layers (e.g., SiGe) and second nanosheet material layers (e.g., Si). The first nanosheet material layers may also be referred to as sacrificial channel layers. Initially, the fins 113 are formed into the multi-layered stack using the patterning techniques disclosed above. Once the fins 113 have been patterned, isolation regions 111 are formed between the fins 113 and the complex dummy gate material layer 125 is formed over the fins 113 and the isolation regions 111. The complex dummy gate material layer 125 comprises a first dummy gate material 119 and a second dummy gate material 121. According to some embodiments, the first dummy gate material 119 comprises a first silicon-based material (e.g., SiGe) and the second dummy gate material 121 comprises a second silicon-based material (e.g., Si). Once the complex dummy gate material layer 125 has been formed, the top portions 203 of the dummy gate electrodes 117 are patterned into the second dummy gate material 121 and then protected by the top spacer 301 using the techniques disclosed above. The techniques described above for extending the openings 201 to pattern the bottom portions 401 of the dummy gate electrodes 117 and to etch through the fins 113 may be equally applied to these embodiments. According to some embodiments, the etch-pull back techniques described above for recessing of the first dummy gate material 119 may also be applied to these embodiments and may further be used to recess the first nanosheets material layers (e.g., SiGe) within the channel regions. Once recessed, the material deposited to form the bottom spacers 601 may also be used to form inner spacers within the recesses of the second nanosheet material layers. Once the openings 201 have been extended through the fins 113, the source/drain regions 801 may be formed in the openings 201. According to some embodiments, the first dummy gate material 119 (e.g., SiGe) is selected as the same material used for the sacrificial channel layers (e.g., SiGe) of the fins 113 and the etch rate of the sacrificial channel layers (e.g., SiGe) is greater than the etch rate of the second nanosheet material layers (e.g., Si). As such during the process for removing the first dummy gate material 119 of the dummy gate electrodes 117, the first nanosheet material layers (e.g., SiGe) in the channel regions of the fins 113 are removed (e.g., in a wire-release technique). The remaining material of the second nanosheet material layers (e.g., Si) forms nanostructures separated by the inner spacers within the channel regions. Once the nanostructures have been formed, a gate dielectric and gate electrode may be formed surrounding the nanostructures within the channel regions.

Embodiments of semiconductor devices and methods of forming such devices such as FinFETs, NSFETs, and GAA devices are disclosed herein. Certain features of the disclosed embodiments provide benefits including large device production yields and device performance are achieved as follows.

The methods and devices disclosed herein provide one or more of the following advantages and benefits. The two-step etching process used on the complex dummy gate material layer 125 allows for the formation of the dummy gate electrodes 117 having top portions 203 comprising a first material and bottom portions 401 comprising a second material. The top spacers 301 are formed over and protect the top portions 203 of the dummy gate electrodes 117 during the patterning of the bottom portions 401 of the dummy gate electrodes 117. Furthermore, the bottom portions of the dummy gate electrode 117 and the openings for the source/drain regions 801 are patterned in a same etching step. As such, the tops of the fins 113 are protected during the formation of the bottom portions 401 of the dummy gate electrode 117 and formation of the openings in the source/drain regions 801 which minimizes or altogether eliminates channel-top damage, dummy gate residue defects, and channel-channel space restrictions. Once formed, the bottom spacers 601 form first interfaces with the tops of the fins 113 and second interfaces with the gate stacks 903, the angle between the first interfaces and the second interfaces is about 90°. Furthermore, the critical dimensions of the metal gate electrode may be controlled to a high degree by the shaping of the top spacers 301 and/or the bottom spacers 601. These features provide high yields during fabrication of semiconductor devices with high device performance.

According to some embodiments, a method includes forming a fin over a semiconductor substrate; depositing a dummy gate material layer over the fin; patterning a top portion of a dummy gate electrode from the dummy gate material layer; forming a top spacer along sidewalls of the top portion of the dummy gate electrode; etching an opening through the dummy gate material layer and through the fin to form a bottom portion of the dummy gate electrode; forming a bottom spacer along a sidewall of the opening; forming a source/drain region in the opening; removing the dummy gate electrode; and depositing a gate stack over the fin. In an embodiment, the method includes depositing a first dummy gate material over the fin and depositing a second dummy gate material over the first dummy gate material, the second dummy gate material being different from the first dummy gate material. In an embodiment of the method, the first dummy gate material has a first etch selectivity and the fin has a second etch selectivity, the first etch selectivity being different than the second etch selectivity. In an embodiment, the method further includes recessing the bottom portion of the dummy gate electrode prior to the forming the bottom spacer. In an embodiment of the method the forming the bottom spacer fills a space left by the recessing the bottom portion with a second spacer material. In an embodiment, the method further includes recessing the top spacer further than the bottom spacer. In an embodiment, the method further includes recessing the bottom spacer further than the top spacer.

According to an embodiment, a method includes forming a fin over a semiconductor substrate; depositing a dummy gate material layer over the fin; etching the dummy gate material layer to a first depth; depositing a first spacer over the dummy gate material layer after the etching the dummy gate material layer; etching an opening through the dummy gate material layer after the depositing the first spacer to form a dummy gate electrode; depositing a second spacer over the first spacer and along a sidewall of the opening; forming a source/drain region in the opening, the second spacer separating the dummy gate electrode from the source/drain region; removing the dummy gate electrode; and depositing a gate stack over the fin. In an embodiment of the method the etching the opening further includes forming a first recess in a sidewall of the dummy gate electrode between the fin and the first spacer; and the depositing the second spacer further includes filling the first recess with the second spacer. In an embodiment of the method, the removing the dummy gate electrode further includes recessing the second spacer a first distance. In an embodiment of the method, the removing the dummy gate electrode further includes recessing the first spacer a second distance, the second distance being less than the first distance. In an embodiment of the method, the removing the dummy gate electrode further includes recessing the first spacer a second distance, the second distance being greater than the first distance. In an embodiment of the method, the depositing the first spacer includes depositing multiple layers of dielectric films. In an embodiment of the method, the depositing the second spacer includes depositing multiple layers of dielectric films.

In another embodiment, a semiconductor device includes a fin over a substrate; a gate electrode stack over the fin; a first top spacer adjacent to the gate electrode stack, the gate electrode stack having a first width adjacent to the first top spacer; a first bottom spacer below the first top spacer, the gate electrode stack having a second width adjacent to the first bottom spacer, the second width being different from the first width; and a first source/drain region adjacent to the fin and isolated from the gate electrode stack by the first bottom spacer. In an embodiment of the semiconductor device the first top spacer includes a multi-layer film having an L-shape. In an embodiment of the semiconductor device, the first bottom spacer includes a multi-layer film having a backwards L-shape. In an embodiment of the semiconductor device, the first width is greater than the second width. In an embodiment of the semiconductor device, the first width is less than the second width. In an embodiment of the semiconductor device, the first top spacer includes a first material and the first bottom spacer includes a second material different from the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin over a semiconductor substrate;
    depositing a dummy gate material layer over the fin;
    forming a top portion of a dummy gate electrode by patterning the dummy gate material layer;
    forming a top spacer along sidewalls of the top portion of the dummy gate electrode;
    forming a bottom portion of the dummy gate electrode by etching an opening through the dummy gate material layer and through the fin;
    forming a bottom spacer along a sidewall of the opening;
    forming a source/drain region in the opening;
    removing the dummy gate electrode; and
    depositing a gate stack over the fin.

2. The method of claim 1, wherein the depositing the dummy gate material layer comprises depositing a first dummy gate material over the fin and depositing a second dummy gate material over the first dummy gate material, the second dummy gate material having a different etch selectivity from the first dummy gate material.

3. The method of claim 1, wherein the forming the top spacer comprises depositing a multilayer film.

4. The method of claim 1, further comprising recessing the bottom portion of the dummy gate electrode prior to the forming the bottom spacer.

5. The method of claim 4, wherein the forming the bottom spacer fills a space left by the recessing the bottom portion with a second spacer material.

6. The method of claim 5, wherein the removing the dummy gate electrode further comprises recessing the top spacer further than the bottom spacer.

7. The method of claim 5, wherein the removing the dummy gate electrode further comprises recessing the bottom spacer further than the top spacer.

8. A method comprising:
    forming a fin over a semiconductor substrate;
    depositing a dummy gate material layer over the fin;
    etching the dummy gate material layer to a first depth;
    depositing a first spacer over the dummy gate material layer after the etching the dummy gate material layer;
    etching an opening through the dummy gate material layer after the depositing the first spacer to form a dummy gate electrode;
    depositing a second spacer over the first spacer and along a sidewall of the opening;
    forming a source/drain region in the opening, the second spacer separating the dummy gate electrode from the source/drain region;
    removing the dummy gate electrode; and
    depositing a gate stack over the fin.

9. The method of claim 8, wherein:
    etching the opening further comprises forming a first recess in a sidewall of the dummy gate electrode between the fin and the first spacer; and
    depositing the second spacer further comprises filling the first recess with the second spacer.

10. The method of claim 9, wherein the removing the dummy gate electrode further comprises recessing the second spacer a first distance.

11. The method of claim 10, wherein the removing the dummy gate electrode further comprises recessing the first spacer a second distance, the second distance being less than the first distance.

12. The method of claim 10, wherein the removing the dummy gate electrode further comprises recessing the first spacer a second distance, the second distance being greater than the first distance.

13. The method of claim 8, wherein the depositing the first spacer comprises depositing multiple layers of dielectric films.

14. The method of claim 8, wherein the depositing the second spacer comprises depositing multiple layers of dielectric films.

15. A method of manufacturing a semiconductor device, the method comprising:
   forming a fin over a substrate;
   forming a gate electrode stack over the fin;
   forming a first bottom spacer adjacent to the gate electrode stack, wherein the forming the first bottom spacer forms a multi-layer film having a backwards L-shape in a first cross-sectional view;
   forming a first top spacer above the first bottom spacer, wherein the forming the first top spacer forms a multi-layer film having an L-shape in a second cross-sectional view; and
   forming a first source/drain region adjacent to the fin and isolated from the gate electrode stack by the first bottom spacer.

16. The method of claim 15, wherein after the forming the gate electrode stack the gate electrode stack has a first width adjacent to the first top spacer and wherein the gate electrode stack has a second width adjacent to the first bottom spacer, the first width being greater than the second width.

17. The method of claim 15, wherein after the forming the gate electrode stack the gate electrode stack has a first width adjacent to the first top spacer and wherein the gate electrode stack has a second width adjacent to the first bottom spacer, the first width being less than the second width.

18. The method of claim 15, wherein the first top spacer comprises a first material and the first bottom spacer comprises a second material different from the first material.

* * * * *